(12) United States Patent
Ryoo et al.

(10) Patent No.: US 12,727,357 B2
(45) Date of Patent: Sep. 1, 2026

(54) DISPLAY DEVICE

(71) Applicant: LG Display Co., Ltd., Seoul (KR)

(72) Inventors: SeungSeok Ryoo, Paju-si (KR); Byeong-Seong So, Paju-si (KR)

(73) Assignee: LG Display Co., Ltd., Seoul (KR)

(*) Notice: Subject to any disclaimer, the term of this patent is extended or adjusted under 35 U.S.C. 154(b) by 602 days.

(21) Appl. No.: 18/059,936

(22) Filed: Nov. 29, 2022

(65) Prior Publication Data

US 2023/0189605 A1 Jun. 15, 2023

(30) Foreign Application Priority Data

Dec. 13, 2021 (KR) ........................ 10-2021-0178037

(51) Int. Cl.
*H10K 59/35* (2023.01)
*G09G 3/3266* (2016.01)
(Continued)

(52) U.S. Cl.
CPC ......... *H10K 59/353* (2023.02); *G09G 3/3266* (2013.01); *G09G 3/3291* (2013.01); *H10D 86/441* (2025.01); *H10D 86/481* (2025.01); *H10D 86/60* (2025.01); *H10K 59/1213* (2023.02); *H10K 59/1216* (2023.02); *H10K 59/131* (2023.02); *H10K 59/65* (2023.02); *G09G 2310/08* (2013.01); *G09G 2320/0233* (2013.01); *G09G 2320/0673* (2013.01)

(58) Field of Classification Search
CPC .. G09G 3/3266; G09G 3/3291; G09G 3/3233; G09G 2310/0251; G09G 2300/0852; G09G 2300/0819; G09G 2320/0673; G09G 2300/0426; H10K 59/1213; H10K 59/131; H10K 59/353; H10K 59/1216; H10K 59/65; H10D 86/481; H10D 86/60; H10D 86/441
See application file for complete search history.

(56) References Cited

U.S. PATENT DOCUMENTS

| | | | |
|---|---|---|---|
| 8,803,770 | B2 | 8/2014 | Jeong et al. |
| 10,720,606 | B2 | 7/2020 | Song et al. |

(Continued)

FOREIGN PATENT DOCUMENTS

| | | | |
|---|---|---|---|
| CN | 108242217 | A | 7/2018 |
| CN | 111613180 | A | 9/2020 |

(Continued)

*Primary Examiner* — Shaheda A Abdin
(74) *Attorney, Agent, or Firm* — Seed Intellectual Property Law Group LLP

(57) ABSTRACT

The present disclosure provides a display device including a plurality of subpixels disposed in a display area for displaying images, each of the subpixels including a light emitting element, a driving transistor for driving the light emitting element. The display area may include a first area, a second area surrounding the first area, and a third area between the first area and the second area. First, second, and third subpixels among the plurality of subpixels are disposed in the first, second, and third areas, respectively. When first data corresponding to the first subpixel is equal to second data corresponds to the second subpixel, the luminance of the first subpixel may be greater than the luminance of the second subpixel.

25 Claims, 28 Drawing Sheets

(51) Int. Cl.

| | |
|---|---|
| ***G09G 3/3291*** | (2016.01) |
| ***H10D 86/40*** | (2025.01) |
| ***H10D 86/60*** | (2025.01) |
| ***H10K 59/121*** | (2023.01) |
| ***H10K 59/131*** | (2023.01) |
| ***H10K 59/65*** | (2023.01) |

(56) References Cited

U.S. PATENT DOCUMENTS

| | | | | |
|---|---|---|---|---|
| 11,489,031 | B2 | 11/2022 | Lee et al. | |
| 11,527,206 | B2 | 12/2022 | Kim et al. | |
| 12,029,075 | B2 * | 7/2024 | Matsueda | H10K 59/353 |
| 2001/0033262 | A1 * | 10/2001 | Funakoshi | G09G 3/3648<br>345/89 |
| 2003/0063080 | A1 * | 4/2003 | Takahashi | G02F 1/1345<br>345/211 |
| 2006/0290614 | A1 * | 12/2006 | Nathan | G09G 3/3233<br>345/76 |
| 2008/0036704 | A1 | 2/2008 | Kim et al. | |
| 2015/0357383 | A1 | 12/2015 | Chung et al. | |
| 2017/0077199 | A1 | 3/2017 | Nguyen et al. | |
| 2017/0345367 | A1 * | 11/2017 | Ka | H10K 59/1213 |
| 2021/0280127 | A1 * | 9/2021 | An | H10H 20/857 |
| 2021/0287610 | A1 | 9/2021 | Kim et al. | |
| 2021/0359056 | A1 * | 11/2021 | Lee | G09G 3/3233 |
| 2022/0044634 | A1 * | 2/2022 | Ka | G09G 3/3258 |

FOREIGN PATENT DOCUMENTS

| | | | |
|---|---|---|---|
| CN | 113130550 | A | 7/2021 |
| CN | 113380196 | A | 9/2021 |
| EP | 4141859 | A1 | 3/2023 |
| KR | 20210024315 | A | 3/2021 |
| KR | 20210081538 | A | 7/2021 |
| KR | 20210114593 | A | 9/2021 |
| TW | 201201180 | A | 1/2012 |

* cited by examiner

OA1
TA1
TA1
OA2
TA2
TA2
NA
EA of Red SP
EA of Green SP
EA of Blue SP
EA
NA
OA1
OA2
NA
HA1
HA2

HL1
HL2
VLn
OA1
TA1
VL1
TA1
VLn
HA1
HA2

HL1
HL1
HL2
OA2
VLn
TA2
TA2
VL2
VLn
HA1
HA2

NA
EA
OA2
TA2
OA1
TA1
ENCAP
PLN
SUB
PAS2
PCL
PAS1
CE
BANK
EL
AE
PLN2
SD2
PLN1
PAS0
SD1
ILD2
ILD1
GI
ABUF2
ABUF1
MBUF
SUB2
IPD
SUB1
ED
DRT
ML2
ML1
LS
GM
TM
GATE
ACT
11
12

NA
TS
TSM
BRG
EA
ED
DRT
OA2
TA2
OA1
TA1
PAC
T-ILD
T-BUF
PAS2
PCL
PAS1
CE
BANK
EL
AE
PLN2
SD2
PLN1
PAS0
SD1
ILD2
ILD1
GI
ABUF2
ABUF1
MBUF
SUB2
IPD
SUB1
ENCAP
PLN
SUB
ML1
ML2
LS
GM
TM
GATE
ACT
11
12

NA
NTA
OA2
TA2
NTA
TA2
OA1
TA1
NTA
TA1
Nna > Noa2 ≥ Noa1
Lna > Loa2 ≥ Loa1
EA
EA of Red SP
EA of Green SP
EA of Blue SP Tkb1
Tkb2
Tinit
Tsen
HIGH
HIGH
LOW
LOW
1st Kick back
2nd Kick back
EM[n]
SC1[n]
SC2[n]
SC3[n]
ELVDD
N2 node
SP3
SP1
ELVDD
N2 node
Vgs_REF
Vn2_REF
1st kick back
2nd kick back
Vgs_C3
Vgs_C3+C4
Vgs_COMP_SP3
Vkb1_SP3
Vkb2_SP3
Vn2_C3
Vn2_C3+C4
Vn2_COMP
Vgs_C1
Vgs_C1+C2
Vgs_COMP_SP1
Vkb1_SP1
Vkb2_SP1
Vn2_C1
Vn2_C1+C2

DISPLAY DEVICE

CROSS-REFERENCE TO RELATED APPLICATION

This application claims the priority benefit of Republic of Korea Patent Application No. 10-2021-0178037, filed on Dec. 13, 2021 in the Korean Intellectual Property Office, which is incorporated herein by reference in its entirety.

BACKGROUND

Technical Field

The present disclosure relates to electronic devices, and more specifically, to display devices.

Description of the Related Art

As display technology advances, display devices can provide increased functions, such as an image capture function, a sensing function, and the like, as well as an image display function. To provide these functions, a display device may need to include an optical electronic device, such as a camera, a sensor for detecting an image, and the like.

In order to receive light passing through a front surface of a display device, it may be desirable for an optical electronic device to be located in an area of the display device where incident light coming from the front surface can be advantageously received or detected. Thus, in such a display device, an optical electronic device may be located in a front portion of the display device to allow the optical electronic device to be effectively exposed to incident light. In order to install the optical electronic device in such an implementation, an increased bezel of the display device may be designed, or a notch or a hole may be formed in a display area of a display panel of the display device.

Therefore, as a display device needs an optical electronic device to receive or detect incident light, and perform an intended function, a size of the bezel in the front portion of the display device may be increased, or a substantial disadvantage may be encountered in designing the front portion of the display device.

BRIEF SUMMARY

The inventors have developed techniques for providing or placing one or more optical electronic devices in a display device without reducing an area of a display area of a display panel of the display device. Through the development, the inventors have invented a display panel and a display device that have a light transmission structure in which even when an optical electronic device is located under a display area of the display panel, and thus, is not exposed in the front surface of the display device, the optical electronic device can normally and properly receive or detect light.

In addition, the inventors have recognized a problem in which as the optical electronic device is overlapped, due to a difference in the number of subpixels per unit area between an optical area including one or more transmission areas and a normal area not including a transmission area, there occurs a difference in luminance between the optical area and the normal area. To address this issue, the inventors have invented a luminance difference compensation technique in order to reduce or eliminate a difference in luminance between the optical area and the normal area.

In addition, the inventors have found a phenomenon in which a boundary area outside of an optical area is abnormally perceived (e.g., a boundary perception phenomenon) by the application of the luminance difference compensation technique, and through various efforts, have invented a technique capable of reducing a degree to which a boundary is perceived or eliminating the boundary perception phenomenon.

One or more embodiments of the present disclosure may provide a display device capable of normally performing display driving in an optical area included in a display area of a display panel and overlapping an optical electronic device.

One or more embodiments of the present disclosure may provide a display device capable of reducing or eliminating a difference in luminance between an optical area and a normal area.

One or more embodiments of the present disclosure may provide a display device capable of reducing or eliminating a difference in luminance between an optical area and a normal area through the application of a compensation capacitor structure to an optical area.

One or more embodiments of the present disclosure may provide a display device capable of reducing or eliminating a difference in luminance between an optical area and a normal area through the application of a gamma curve differentiation technique between the optical area and the normal area.

One or more embodiments of the present disclosure may provide a display device capable of reducing or preventing the perception of a boundary between an optical area and a normal area.

According to aspects of the present disclosure, a display device is provided that includes a display area, and a plurality of subpixels disposed in the display area. The display area may include a first area, a second area laterally surrounding the first area, and a third area located between the first area and the second area, and first, second and third subpixels among the plurality of subpixels may be disposed in the first, second, and third areas, respectively.

Each of the first, second, and third subpixels may include a first node, a second node, a third node, and a fourth node, and include a light emitting element connected to the fourth node, a driving transistor controlled by a voltage at the second node and configured to drive the light emitting element, a first transistor controlled by a first scan signal supplied through a first scan line and configured to control a connection between the second node and the third node, a second transistor controlled by an emission control signal supplied through an emission control line and configured to control a connection between the first node and a driving voltage line, and a third transistor controlled by the emission control signal and configured to control a connection between the third node and the fourth node.

The first subpixel may include at least one of a first compensation capacitor between the second node and the first scan line and a second compensation capacitor between the second node and the emission control line.

The third subpixel may include at least one of a third compensation capacitor between the second node and the first scan line and a fourth compensation capacitor between the second node and the emission control line.

According to aspects of the present disclosure, a display device is provided that includes a substrate including a display area, a plurality of gate lines disposed over the substrate, and a plurality of subpixels disposed in the display area. The display area may include a first area, a second area laterally surrounding the first area, and a third area located between the first area and the second area. A first gate line among the plurality of gate lines may run through the second area, the third area, and the first area. First, second and third subpixels among the plurality of subpixels may be disposed in the first, second, and third areas, respectively.

Each of the first subpixel, the second subpixel, and the third subpixel may include a light emitting element and a driving transistor.

The first gate line may overlap a first connection pattern corresponding to the gate node of the driving transistor in the first subpixel, may not overlap a second connection pattern corresponding to the gate node of the driving transistor in the second subpixel, and may overlap a third connection pattern corresponding to the gate node of the driving transistor in the third subpixel.

According to aspects of the present disclosure, a display device is provided that includes a display area, and a plurality of subpixels disposed in the display area. The display area may include a first area, a second area laterally surrounding the first area, and a third area located between the first area and the second area, and first, second and third subpixels among the plurality of subpixels may be disposed in the first, second, and third areas, respectively.

Each of the first subpixel, the second subpixel, and the third subpixel may include a light emitting element and a driving transistor for driving the light emitting element.

In an example where first data corresponding to the first subpixel is equal to second data corresponding to the second subpixel, the luminance of the first subpixel may be greater than the luminance of the second subpixel.

According to aspects of the present disclosure, a display device is provided that includes a display area and a gate line. The display area may include a first optical area, a second optical area, and a normal area. The first optical area includes: first transmission areas; and a first plurality of subpixels, each of the first plurality of subpixels including a first driving transistor and a first connection area corresponding to a gate node of the first driving transistor. The second optical area includes: second transmission areas that have different shape than the first transmission areas; and a second plurality of subpixels, each of the second plurality of subpixels including a second driving transistor and a second connection area corresponding to a gate node of the second driving transistor. The normal area laterally surrounds the first optical area and the second optical area. The normal area has lower transmissibility than those of the first optical area and the second optical area. The normal area includes a third plurality of subpixels. Each of the third plurality of subpixels includes a third driving transistor and a third connection area corresponding to a gate node of the third driving transistor. The gate line overlaps a first subpixel of the first plurality of subpixels, a second subpixel of the second plurality of subpixels, and a third subpixel of the third plurality of subpixels. First capacitance between the gate node of the first driving transistor of the first subpixel and the gate line is greater than third capacitance between the gate node of the third driving transistor of the third subpixel and the gate line. Second capacitance between the gate node of the second driving transistor of the second subpixel and the gate line is greater than the third capacitance.

According to one or more embodiments of the present disclosure, a display device can be provided that is capable of normally performing display driving in an optical area included in a display area of a display panel and overlapping an optical electronic device.

According to one or more embodiments of the present disclosure, a display device can be provided that is capable of reducing or eliminating a difference in luminance between an optical area and a normal area.

According to one or more embodiments of the present disclosure, a display device can be provided that is capable of reducing or eliminating a difference in luminance between an optical area and a normal area through the application of a compensation capacitor structure to an optical area.

According to one or more embodiments of the present disclosure, a display device can be provided that is capable of reducing or eliminating a difference in luminance between an optical area and a normal area through the application of a gamma curve differentiation technique between the optical area and the normal area.

According to one or more embodiments of the present disclosure, a display device can be provided that is capable of reducing or preventing the perception of a boundary between an optical area and a normal area.

BRIEF DESCRIPTION OF THE SEVERAL VIEWS OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1A:
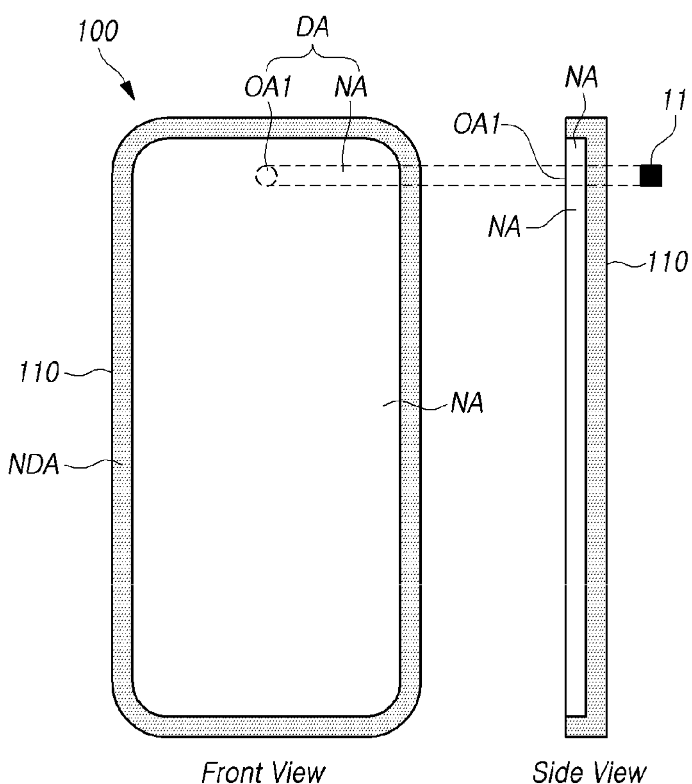
FIGS. 1A, 1B and 1C are plan views illustrating an example display device according to aspects of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer may be directly connected, coupled, or adhered to another element or layer, may be indirectly connected, coupled, or adhered to another element or layer with one or more intervening elements or layers "disposed" or "interposed" between the elements or layers, or both, unless otherwise specified. For the expression that an element or layer "contacts," "overlaps," or the like with another element or layer, the element or layer may directly contact, overlap, or the like another element or layer, may indirectly contact, overlap, or the like another element or layer with one or more intervening elements or layers "disposed" or "interposed" between the elements or layers, or both, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)," is used. In construing an element, the element is to be construed as including an error or tolerance range even where no explicit description of such an error or tolerance range is provided. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Figure 1B:
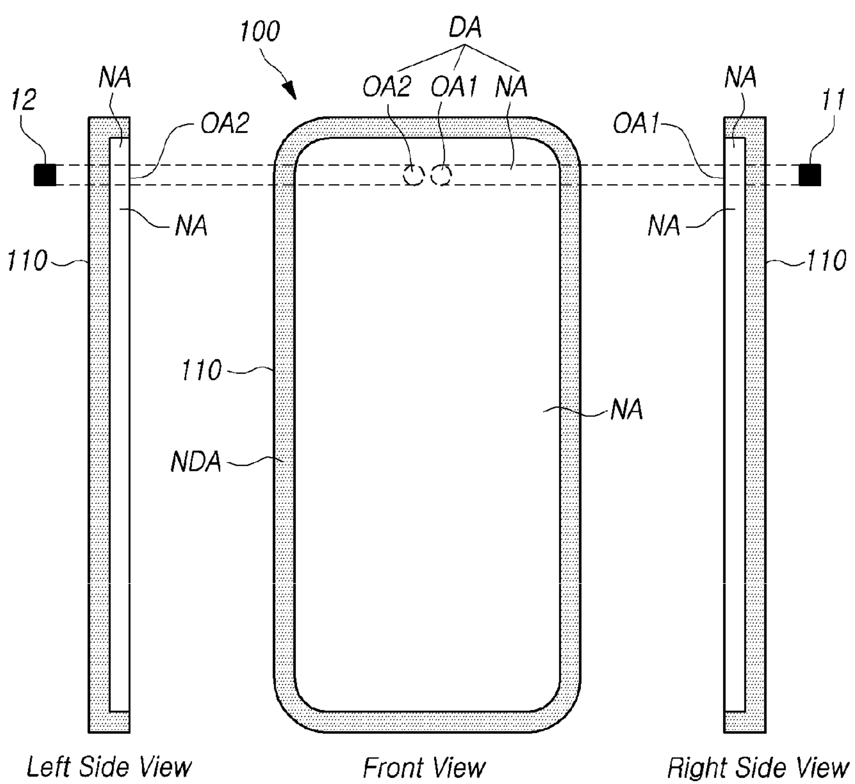
Figure 1C:
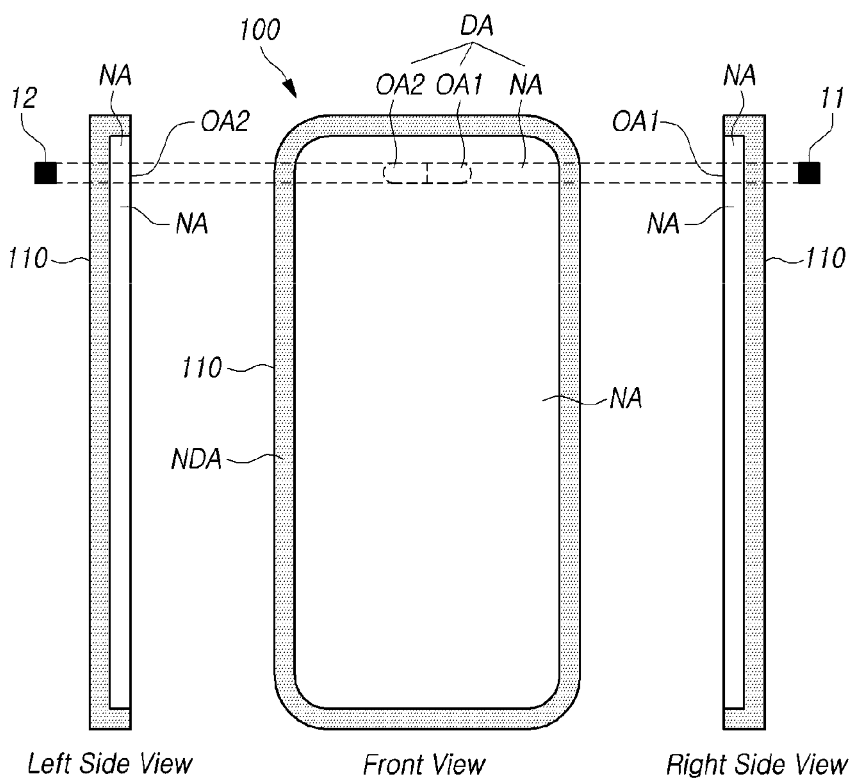

FIGS. 1A, 1B and 1C are plan views illustrating an example display device 100 according to aspects of the present disclosure.

Referring to FIGS. 1A, 1B, and 1C, a display device according to aspects of the present disclosure may include a display panel 110 for displaying an image, and one or more optical electronic devices 11, 12. Herein, an optical electronic device may be referred to as a light detector, a light receiver, or a light sensing device. An optical electronic device may include one or more of a camera, a camera lens, a sensor, a sensor for detecting images, or the like.

The display panel 110 may include a display area DA in which an image is displayed and a non-display area NDA in which an image is not displayed. A plurality of subpixels can be arranged in the display area DA, and several types of signal lines for driving the plurality of subpixels can be arranged therein.

The non-display area NDA may refer to an area outside of the display area DA. Several types of signal lines may be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, and 1C, in the display device 100 according to aspects of the present disclosure, one or more optical electronic devices (11, 12) may be located under, or in a lower portion of, the display panel 110 (an opposite side of a viewing surface thereof).

Light can enter the front surface (viewing surface) of the display panel 110, pass through the display panel 110, reach one or more optical electronic devices (11, 12) located under, or in the lower portion of, the display panel 110 (the opposite side of the viewing surface).

The one or more optical electronic devices (11, 12) can receive or detect light transmitting through the display panel 110 and perform a predefined function based on the received light. For example, the one or more optical electronic devices (11, 12) may include one or more of an image capture device such as a camera (an image sensor), and/or the like, and a sensor such as a proximity sensor, an illuminance sensor, and/or the like.

Referring to FIGS. 1A, 1B, and 1C, in the display panel 110 according to aspects of the present disclosure, the display area DA may include one or more optical areas (OA1, OA2) and a normal area NA. Herein, the term "normal area" NA is an area that while being present in the display area DA, does not overlap with one or more optical electronic devices (11, 12) and may also be referred to as a non-optical area. The one or more optical areas (OA1, OA2) may be one or more respective areas overlapping the one or more optical electronic devices (11, 12).

According to an example of FIG. 1A, the display area DA may include a first optical area OA1 and a normal area NA. In this example, at least a portion of the first optical area OA1 may overlap a first optical electronic device 11.

According to an example of FIG. 1B, the display area DA may include a first optical area OA1, a second optical area OA2, and a normal area NA. In the example of FIG. 1B, at least a portion of the normal area NA may be present between the first optical area OA1 and the second optical area OA2. In this example, at least a portion of the first optical area OA1 may overlap the first optical electronic device 11, and at least a portion of the second optical area OA2 may overlap a second optical electronic device 12.

According to an example of FIG. 1C, the display area DA may include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 may contact each other (e.g., directly contact each other). In this example, at least a portion of the first optical area OA1 may overlap the first optical electronic device 11, and at least a portion of the second optical area OA2 may overlap the second optical electronic device 12.

In some embodiments, an image display structure and a light transmission structure are desirable to be formed in the one or more optical areas (OA1, OA2). For example, since the one or more optical areas (OA1, OA2) are a portion of the display area DA, therefore, subpixels for displaying an image are needed to be disposed in the one or more optical areas (OA1, OA2). Further, to enable light to transmit the one or more optical electronic devices (11, 12), a light transmission structure is needed, and thus is formed in the one or more optical areas (OA1, OA2).

Even though the one or more optical electronic devices (11, 12) are needed to receive or detect light, the one or more optical electronic devices (11, 12) may be located on the back of the display panel 110 (e.g., on an opposite side of a viewing surface). In this embodiment, the one or more optical electronic devices (11, 12) are located, for example, under, or in a lower portion of, the display panel 110, and is configured to receive light that has transmitted the display panel 110. For example, the one or more optical electronic devices (11, 12) are not exposed in the front surface (viewing surface) of the display panel 110. Accordingly, when a user faces the front surface of the display device 110, the one or more optical electronic devices (11, 12) are located so that they are invisible or have reduced visibility to the user.

In one embodiment, the first optical electronic device 11 may be a camera, and the second optical electronic device 12 may be a sensor such as a proximity sensor, an illuminance sensor, an infrared sensor, and/or the like. For example, the camera may be a camera lens, an image sensor, or a unit or device including at least one of the camera lens and the image sensor. The sensor may be, for example, an infrared sensor capable of detecting infrared rays. In another embodiment, the first optical electronic device 11 may be a sensor, and the second optical electronic device 12 may be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera may be a camera lens, an image sensor, or a unit or device including at least one of the camera lens and the image sensor.

In the example where the first optical electronic device 11 is a camera, this camera may be located on the back of (e.g., under, or in a lower portion of) the display panel 110, and be a front camera capable of capturing objects or images in a front direction of the display panel 110. Accordingly, the user can capture an image or object through the camera that is invisible or obscured on the viewing surface while looking at the viewing surface of the display panel 110.

Although the normal area NA and the one or more optical areas (OA1, OA2) included in the display area DA in each of FIGS. 1A, 1B, and 1C are areas where images can be displayed, the normal area NA is an area where a light transmission structure need not be formed, but the one or more optical areas (OA1, OA2) are areas where the light transmission structure need be formed. Thus, in some embodiments, the normal area NA is an area where a light transmission structure is not implemented or included, and the one or more optical areas (OA1, OA2) are areas in which the light transmission structure is implemented or included.

Accordingly, the one or more optical areas (OA1, OA2) may have a transmittance greater than or equal to a predetermined or selected level, e.g., a relatively high transmittance, and the normal area NA may not have light transmittance or have a transmittance less than the predetermined level e.g., a relatively low transmittance.

For example, the one or more optical areas (OA1, OA2) may have a resolution, a subpixel arrangement structure, the number of subpixels per unit area, an electrode structure, a line structure, an electrode arrangement structure, a line arrangement structure, or/and the like different from that/those of the normal area NA.

In an embodiment, the number of subpixels per unit area in the one or more optical areas OA1, OA2 may be less than the number of subpixels per unit area in the normal area NA. For example, the resolution of the one or more optical areas (OA1, OA2) may be lower than that of the normal area NA. Here, the number of pixels (or subpixels) per unit area may have the same meaning as resolution, density of pixels (or subpixels), or a degree of integration of pixels (or subpixels). For example, the number of pixels (or subpixels) per unit area can be measured using pixels (or subpixels) per inch (PPI), which represents the number of pixels (or subpixels) within 1 inch.

In an embodiment of each of FIGS. 1A, 1B, and 1C, the number of subpixels per unit area in the first optical areas OA1 may be less than the number of subpixels per unit area in the normal area NA. In an embodiment of each of FIGS. 1A, 1B, and 1C, the number of subpixels per unit area in the second optical areas OA2 may be greater than or equal to the number of subpixels per unit area in the first optical areas OA1, and be less than the number of subpixels per unit area in the normal area NA.

In an embodiment of each of FIGS. 1A, 1B, and 1C, as a method for increasing a transmittance of at least one of the first optical area OA1 and the second optical area OA2, a technique (which may be referred to as a "pixel density differentiation design scheme") may be applied so that a density of pixels (or subpixels) or a degree of integration of pixels (or subpixels) can be differentiated as described above. According to the pixel density differentiation design scheme, in an embodiment, the display panel 110 may be configured or designed such that the number of subpixels per unit area of at least one of the first optical area OA1 and the second optical area OA2 is greater than the number of subpixels per unit area of the normal area NA.

In another embodiment, as another method for increasing a transmittance of at least one of the first optical area OA1 and the second optical area OA2, another technique (which may be referred to as a "pixel size differentiation design scheme") may be applied so that a size of a pixel can be differentiated. According to the pixel size differentiation design scheme, the display panel 110 may be configured or designed such that the number of subpixels per unit area of at least one of the first optical area OA1 and the second optical area OA2 is equal to or similar to the number of subpixels per unit area of the normal area NA; however, a size of each subpixel (e.g., a size of a corresponding light emitting area) disposed in at least one of the first optical area OA1 and the second optical area OA2 is smaller than a size of each subpixel (e.g., a size of a corresponding light emitting area) disposed in the normal area NA.

In some embodiments, for convenience of description, the discussion that follows is provided based on the pixel density differentiation design scheme of the two schemes (e.g., the pixel density differentiation design scheme and the pixel size differentiation design scheme) for increasing the transmittance of at least one of the first optical area OA1 and the second optical area OA2, unless explicitly stated otherwise. In this manner, in discussions that follow, a small number of subpixels per unit area may be used as a meaning that a subpixel has a small size, and a large number of subpixels per unit area may be used as a meaning that a subpixel has a large size.

In each of FIGS. 1A, 1B, and 1C, the first optical area OA1 may have various shapes, such as a circle, an ellipse, a quadrangle, a hexagon, an octagon or the like. In each of FIGS. 1B, and 1C, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like. Hereinafter, for convenience of description, discussions will be conducted based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

When the display device 100 according to aspects of the present disclosure has a structure in which the first optical electronic device 11 such as a camera, and the like. is located under, or in a lower portion of, the display panel 100 without being exposed to the outside, such a display device 100 according to aspects of the present disclosure may be referred to as a display in which under-display camera (UDC) technology is implemented.

According to this example, in the display device 100 according to aspects of the present disclosure, a reduction of an area or size of the display area DA can be prevented because a notch or a camera hole for exposing a camera need not be formed in the display panel 110. Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11, 12) are located on the back of (e.g., under, or in a lower portion of) the display panel 110 of the display device 100 (e.g., hidden or not exposed to the outside), in some aspects, the one or more optical electronic devices (11, 12) can perform normal predefined functionalities, and thus, receive or detect light.

Further, in the display device 100 according to aspects of the present disclosure, although one or more optical electronic devices (11, 12) are located on the back of (e.g., under, or in a lower portion of) the display panel 110 to be hidden and located to be overlap the display area DA, it is beneficial for image display to be normally performed in the one or more optical areas (OA1, OA2) overlapping the one or more optical electronic devices (11, 12) in the area DA. Thus, in one or more examples, even though one or more optical electronic devices 11 and 12 are located on the back of the display panel, images can be displayed in a normal manner (e.g., without reduction in image quality) in the one or more optical areas OA1 and OA2 overlapping the one or more optical electronic devices 11 and 12 in the area DA.

Figure 2:
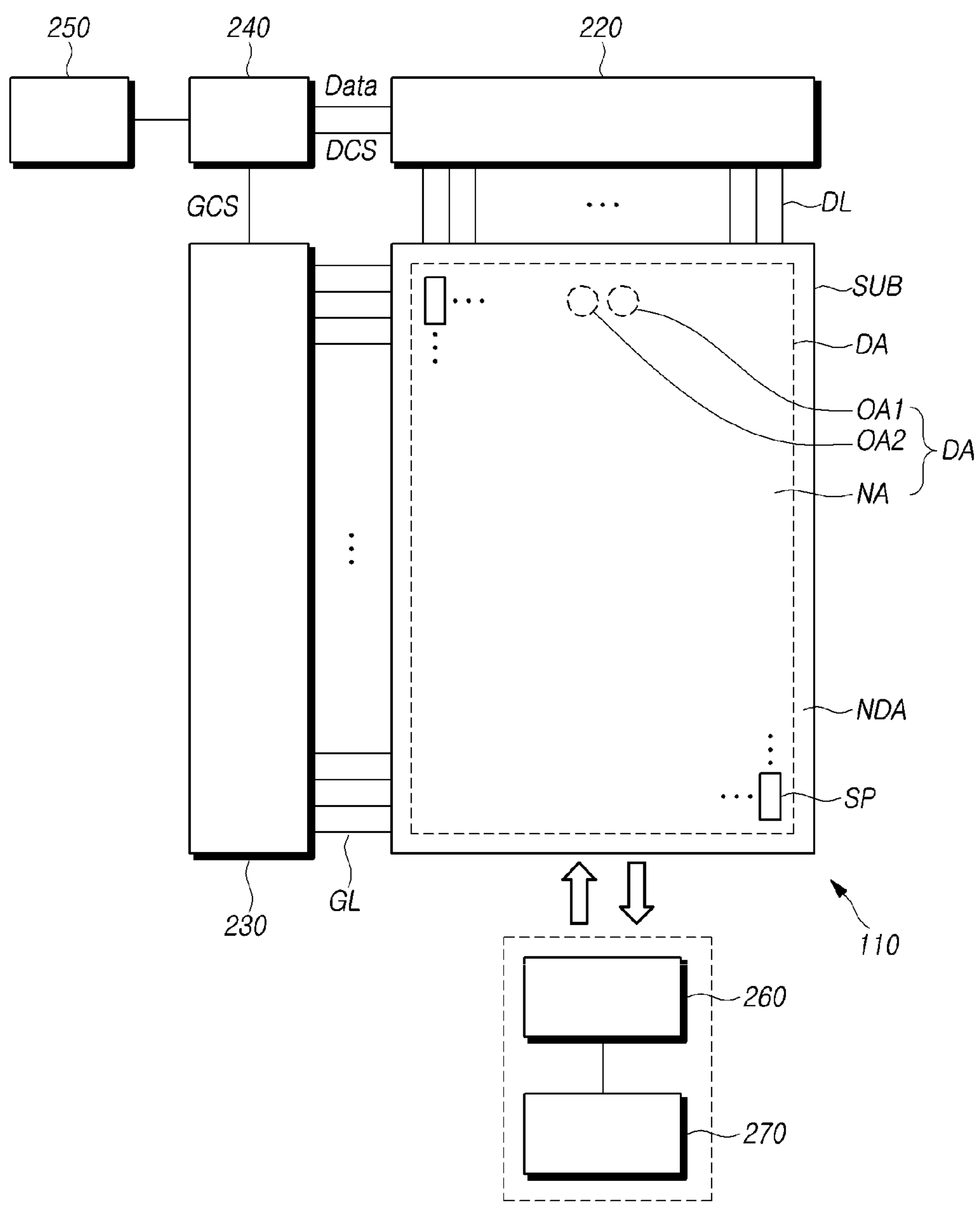
FIG. 2 illustrates an example system configuration of the display device according to aspects of the present disclosure.

FIG. 2 illustrates an example system configuration of the display device 100 according to aspects of the present disclosure. Referring to FIG. 2, the display device 100 may include the display panel 110 and a display driving circuit as components for displaying an image.

The display driving circuit is a circuit for driving the display panel 110, and may include a data driving circuit 220, a gate driving circuit 230, a display controller 240, and other components.

The display panel 110 may include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is bent and invisible from the front surface of the display device 100.

The display panel 110 may include a substrate SUB and a plurality of subpixels SP disposed on the substrate SUB. The display panel 110 may further include various types of signal lines to drive the plurality of subpixels SP.

The display device 100 according to aspects of the present disclosure may be a liquid crystal display device, or the like, or a self-emission display device in which light is emitted from the display panel 110 itself. In an example where the display device 100 according to aspects of the present disclosure is the self-emission display device, each of the plurality of subpixels SP may include a light emitting element. In one embodiment, the display device 100 according to aspects of the present disclosure may be an organic light emitting display device in which the light emitting element is implemented using an organic light emitting diode (OLED). For another embodiment, the display device 100 according to aspects of the present disclosure may be an inorganic light emitting display device in which the light emitting element is implemented using an inorganic material-based light emitting diode. In further another embodiment, the display device 100 according to aspects of the present disclosure may be a quantum dot display device in which the light emitting element is implemented using quantum dots, which are self-emission semiconductor crystals.

The structure of each of the plurality of subpixels SP may vary according to types of the display devices 100. For example, in an example where the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (which may be referred to as data voltages or image signals), a plurality of gate lines GL for carrying gate signals (which may be referred to as scan signals), and the like.

The plurality of data lines DL and the plurality of gate lines GL may overlap each other. Each of the plurality of data lines DL may extend in a first direction. Each of the plurality of gate lines GL may extend in a second direction. For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 may be a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can receive the digital image data Data from the display controller 240, convert the received image data Data into analog data signals, and supply the resulting analog data signals to the plurality of data lines DL.

The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some embodiments, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another embodiment, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

In some embodiments, at least one of the data driving circuit 220 and the gate driving circuit 230 may be disposed in the display area DA of the display panel 110. For example, at least one of the data driving circuit 220 and the gate driving circuit 230 may be disposed not to overlap subpixels SP, or disposed to overlap one or more, or all, of the subpixels SP.

The data driving circuit 220 may also be located on, but not limited to, only one side or portion (e.g., an upper edge or a lower edge) of the display panel 110. In some embodiments, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In some embodiments, the gate driving circuit 230 may be connected to two sides or portions (e.g., a left edge and a right edge) of the panel 110, or be connected to at least two of four sides or portions (e.g., an upper edge, a lower edge, the left edge, and the right edge) of the panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of performing other control functions in addition to the function of the typical timing controller. In some embodiments, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more predefined interfaces. In some embodiments, such interfaces may include a low voltage differential signaling (LVDS) interface, an embedded clock point-point (EPI) interface, a serial peripheral interface (SP), and the like.

In order to further provide a touch sensing function, as well as an image display function, the display device 100 according to aspects of the present disclosure may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. In the example where the touch sensor is implemented in the touch panel, or in the form of the touch panel, outside of the display panel 110, such a touch sensor is referred to as an add-on type. In the example where the add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

In the example where the touch sensor is implemented inside of the display panel 110, a process of manufacturing the display panel 110 may include disposing the touch sensor over the substrate SUB together with signal lines and electrodes related to driving the display device 100.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing method or a mutual-capacitance sensing method.

In the example where the touch sensing circuit performs touch sensing in the self-capacitance sensing method, the touch sensing circuit can perform touch sensing based on capacitance between each touch electrode and a touch object (e.g., a finger, a pen, and the like). According to the self-capacitance sensing method, each of the plurality of touch electrodes can serve as both a driving touch electrode and a sensing touch electrode. The touch driving circuit 260 can drive all, or one or more, of the plurality of touch electrodes and sense al, or one or more, of the plurality of touch electrodes.

In the example where the touch sensing circuit performs touch sensing in the mutual-capacitance sensing method, the touch sensing circuit can perform touch sensing based on capacitance between touch electrodes. According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may be a mobile terminal such as a smart phone, a tablet, or the like, or a monitor, a television (TV), or the like. Such devices may be of various types, sizes, and shapes. The display device 100 according to embodiments of the present disclosure are not limited thereto, and includes displays of various types, sizes, and shapes for displaying information or images.

As described above, the display area DA of the display panel 110 may include a normal area NA and one or more optical areas (OA1, OA2), for example, as shown in FIGS. 1A, 1B, and 1C. The normal area NA and the one or more optical areas (OA1, OA2) are areas where an image can be displayed. However, the normal NA is an area in which a light transmission structure need not be implemented, and the one or more optical areas (OA1, OA2) are areas in which the light transmission structure need be implemented.

As discussed above with respect to the examples of FIGS. 1A, 1B, and 1C, although the display area DA of the display panel 110 may include the one or more optical areas (OA1, OA2) in addition to the normal area NA, for convenience of description, in the discussion that follows, it is assumed that the display area DA includes first and second optical areas (OA1, OA2) and the normal area NA, and the normal area NA thereof includes the normal areas NAs in FIGS. 1A to 1C, and the first and second optical areas (OA1, OA2) thereof include the first optical areas OA1*s* in FIGS. 1A, 1B, and 1C and the second optical areas OA2*s* of FIGS. 1B and 1C, respectively, unless explicitly stated otherwise.

Figure 3:
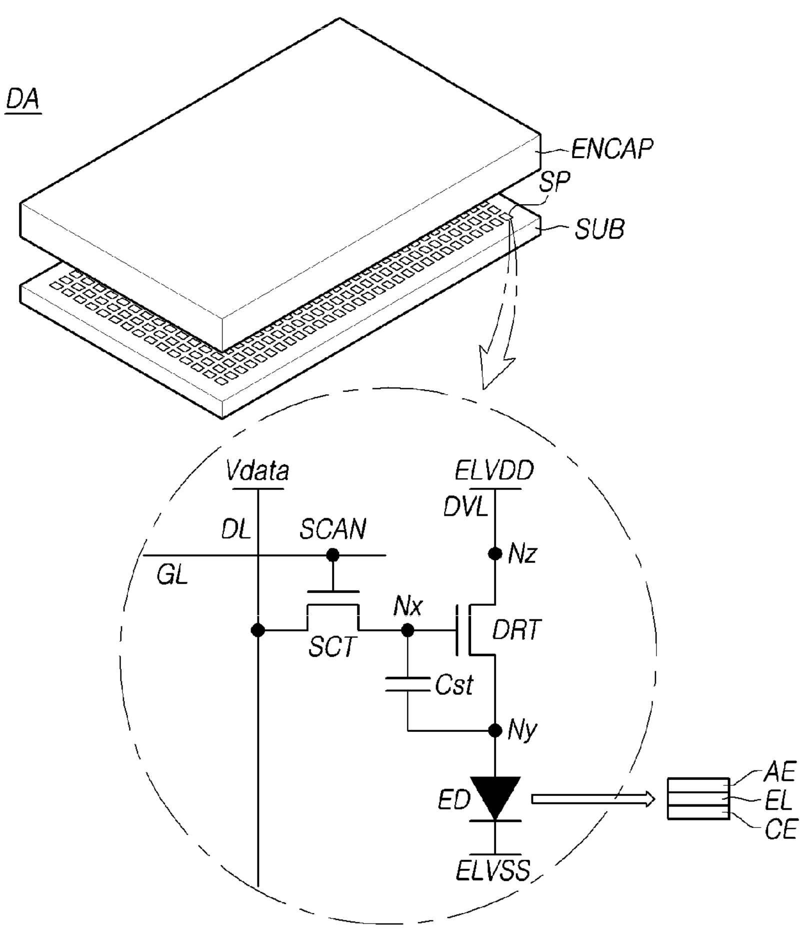
FIG. 3 illustrates an example equivalent circuit of a subpixel in a display panel according to aspects of the present disclosure.

FIG. 3 illustrates an example equivalent circuit of a subpixel SP in the display panel 110 according to aspects of the present disclosure.

Each of subpixels SP disposed in the normal area NA, the first optical area OA1, and the second optical area OA2 included in the display area DA of the display panel 110 may include a light emitting element ED, a driving transistor DRT for driving the light emitting element ED, a scan transistor SCT for transmitting a data voltage Vdata to a first node Nx of the driving transistor DRT, a storage capacitor Cst for maintaining a voltage at an approximate constant level during one frame, and the like.

The driving transistor DRT may include the first node Nx to which a data voltage is applied, a second node Ny electrically connected to the light emitting element ED, and a third node Nz to which a driving voltage ELVDD through a driving voltage line DVL is applied. In the driving transistor DRT, the first node Nx may be a gate node, the second node Ny may be a source node or a drain node, and the third node Nz may be the drain node or the source node.

The light emitting element ED can include an anode electrode AE, an emission layer EL, and a cathode electrode CE. The anode electrode AE may be a pixel electrode disposed in each subpixel SP, and may be electrically connected to the second node Ny of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In an example where the organic light emitting diode is used as the light emitting element ED, the emission layer EL thereof may include an organic emission layer including an organic material.

The scan transistor SCT may be turned on and off by a scan signal SCAN that is a gate signal applied through a gate line GL, and be electrically connected between the first node Nx of the driving transistor DRT and a data line DL.

The storage capacitor Cst may be electrically connected between the first node Nx and the second node Ny of the driving transistor DRT.

Each subpixel SP may include two transistors (2T: DRT and SCT) and one capacitor (1C: Cst) (which may be referred to as a "2T1C structure") as shown in FIG. 3, and in some cases, may further include one or more transistors, or further include one or more capacitors.

The storage capacitor Cst may be an external capacitor intentionally designed to be located outside of the driving transistor DRT, other than an internal capacitor, such as a parasitic capacitor (e.g., a Cgs, a Cgd), that may be present between the first node Nx and the second node Ny of the driving transistor DRT. Each of the driving transistor DRT and the scan transistor SCT may be an n-type transistor or a p-type transistor.

Since circuit elements (e.g., in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (e.g., in particular, the light emitting element ED). The encapsulation layer ENCAP may be disposed to cover the light emitting element ED.

Figure 4:
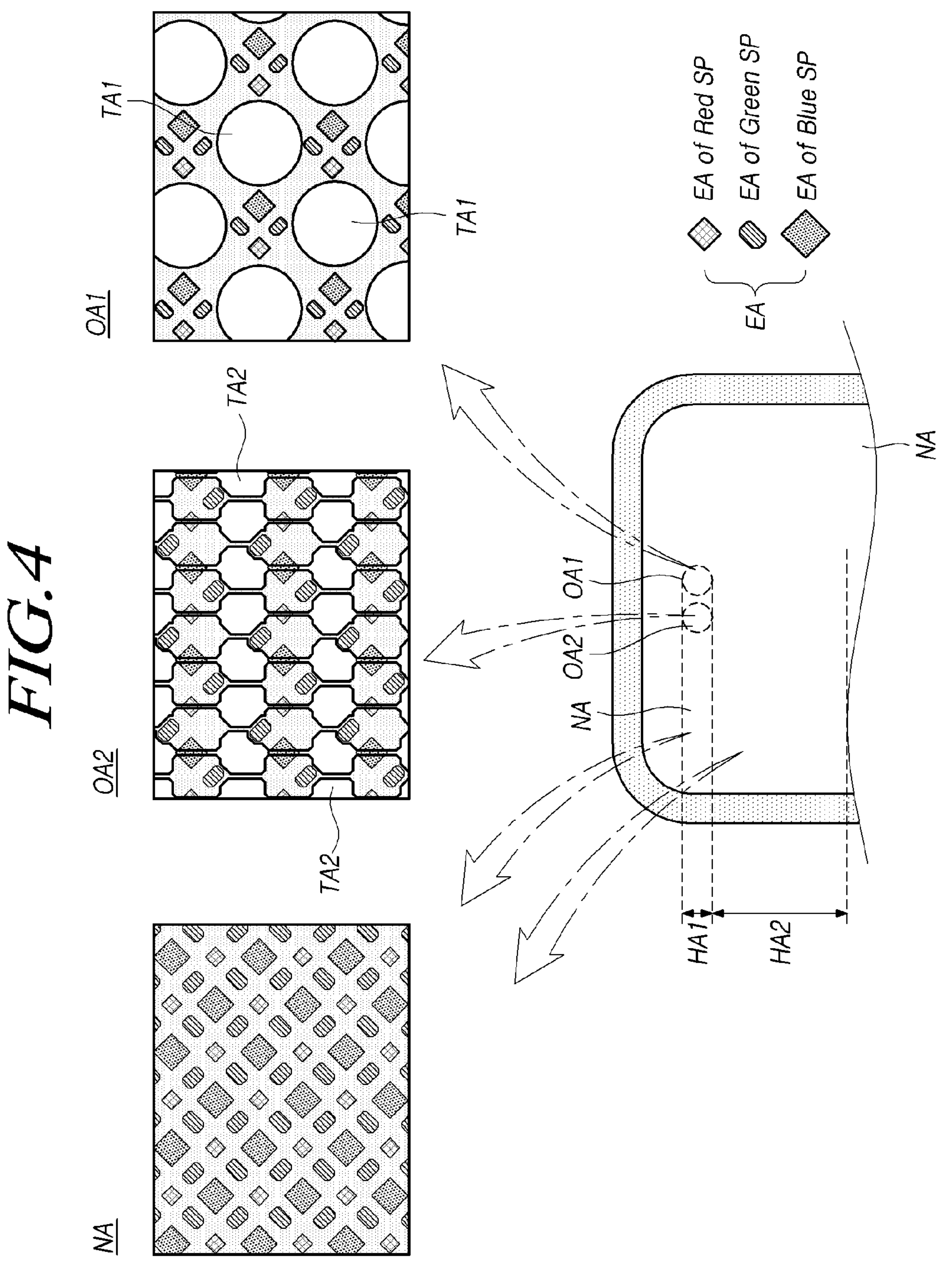
FIG. 4 illustrates example arrangements of subpixels in three areas included in a display area of the display panel according to aspects of the present disclosure.

FIG. 4 illustrates example arrangements of subpixels SP in the three areas (NA, OA1, and OA2) included in the display area DA of the display panel 110 according to aspects of the present disclosure.

Referring to FIG. 4, in some embodiments, a plurality of subpixels SP may be disposed in each of the normal area NA, the first optical area OA1, and the second optical area OA2 included in the display area DA.

The plurality of subpixels SP may include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

Referring to FIG. 4, in some embodiments, the normal area NA may not include a light transmission structure, but may include light emitting areas EA. However, in some embodiments, the first optical area OA1 and the second optical area OA2 need to include both the light emitting areas EA and the light transmission structure. Accordingly, the first optical area OA1 can include light emitting areas EA and first transmission areas TA1, and the second optical area OA2 can include the light emitting areas EA and second transmission area TA2.

The light emitting areas EA and the transmission areas (TA1, TA2) may be distinct according to whether the transmission of light is allowed. For example, the light emitting areas EA may be areas not allowing light to transmit (e.g., not allowing light to transmit to the back of the display panel), and the transmission areas (TA1, TA2) may be areas allowing light to transmit (e.g., allowing light to transmit to the back of the display panel).

The light emitting areas EA and the transmission areas (TA1, TA2) may be also distinct according to whether or not a specific metal layer is included. For example, the cathode electrode CE as shown in FIG. 3 may be disposed in the light emitting areas EA, and the cathode electrode CE may not be disposed in the transmission areas (TA1, TA2). In some embodiments, a light shield layer may be disposed in the light emitting areas EA, and a light shield layer may not be disposed in the transmission areas (TA1, TA2).

Since the first optical area OA1 includes the first transmission areas TA1 and the second optical area OA2 includes the second transmission areas TA2, both of the first optical area OA1 and the second optical area OA2 are areas through which light can pass.

In one embodiment, a transmittance (a degree of transmission) of the first optical area OA1 and a transmittance (a degree of transmission) of the second optical area OA2 may be substantially equal. For example, the first transmission area TA1 of the first optical area OA1 and the second transmission area TA2 of the second optical area OA2 may have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 may be substantially equal. In an example, each of the first transmission areas TA1*s* has the same shape and size. In an example, each of the second transmission areas TA2*s* has the same shape and size.

In another embodiment, a transmittance (a degree of transmission) of the first optical area OA1 and a transmittance (a degree of transmission) of the second optical area OA2 may be different. For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 may be different from each other.

For example, in the example where the first optical electronic device 11, as shown in FIGS. 1A, 1B and 1C, overlapping the first optical area OA1 is a camera, and the second optical electronic device 12, as shown in FIGS. 1B and 1C, overlapping the first optical area OA1 is a camera, overlapping the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2. For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 may be greater than a ratio of the second transmission area TA2 to the second optical area OA2.

For convenience of description, the discussion that follows is provided based on the embodiment in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency. Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise.

Referring to FIG. 4, a horizontal display area in which the first optical area OA1 and the second optical area OA2 are disposed is referred to as a first horizontal display area HAL and another horizontal display area in which the first optical area OA1 and the second optical area OA2 are not disposed is referred to as a second horizontal display area HA2.

Referring to FIG. 4, the first horizontal display area HA1 may include a portion of the normal area NA, the first optical area OA1, and the second optical area OA2. The second horizontal display area HA2 may include only another portion of the normal area NA.

Figure 5A:
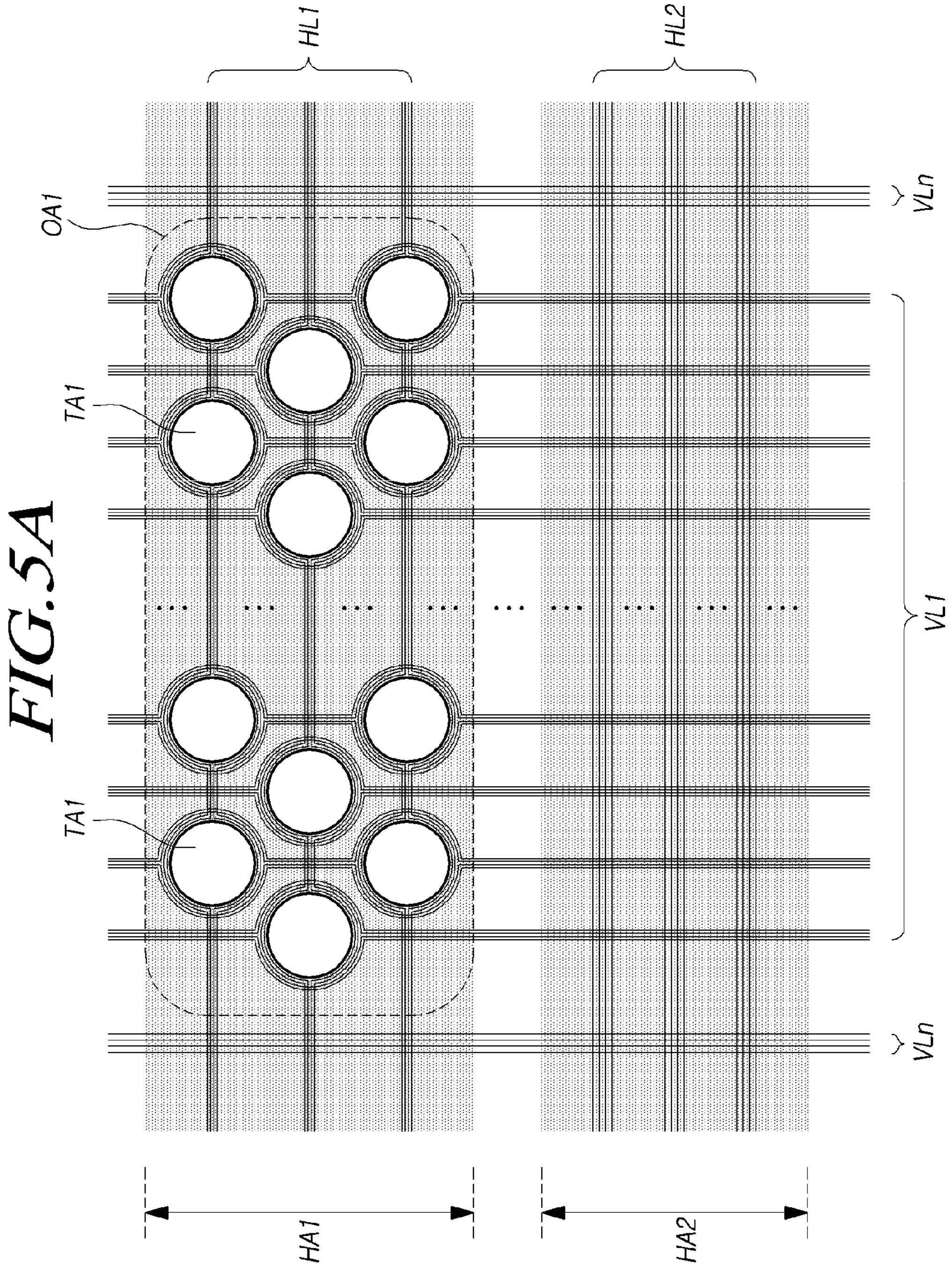
FIG. 5A illustrates example arrangements of signal lines in each of a first optical area and a normal area in the display panel according to aspects of the present disclosure.
Figure 5B:
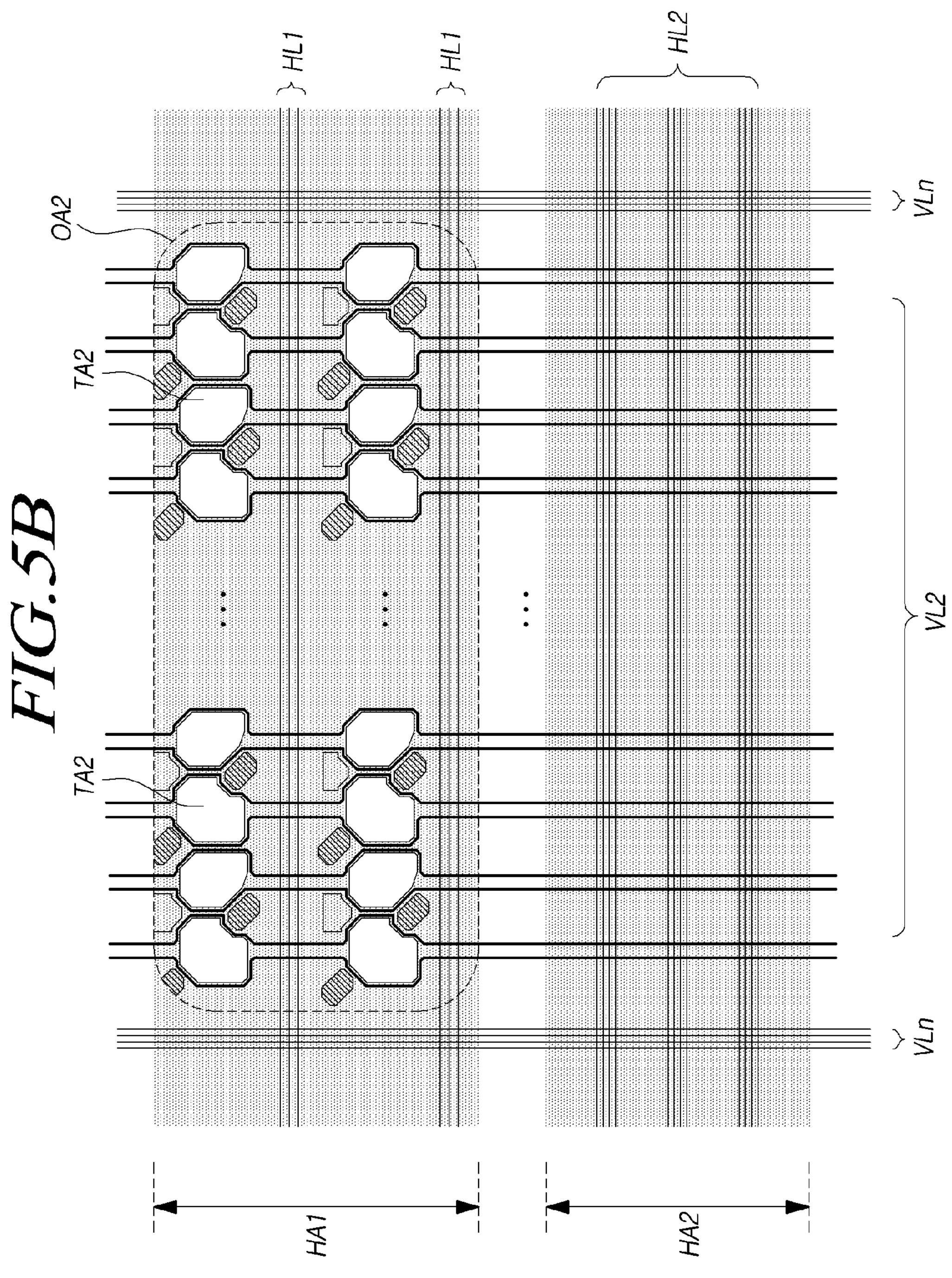
FIG. 5B illustrates example arrangements of signal lines in each of a second optical area and the normal area in the display panel according to aspects of the present disclosure.

FIG. 5A illustrates example arrangements of signal lines in each of the first optical area OA1 and the normal area NA of the display panel 110 according to aspects of the present disclosure, and FIG. 5B illustrates example arrangements of signal lines in each of the second optical area OA2 and the normal area NA of the display panel 110 according to aspects of the present disclosure.

First horizontal display areas HA1 shown in FIGS. 5A and 5B are portions of the first horizontal display area HA1 of the display panel 110, and second horizontal display area HA2 therein are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 may include a portion of the normal area NA, the first optical area OA1, and the second optical area OA2. The second horizontal display area HA2 may include another portion of the normal area NA.

Various types of horizontal lines (HL1, HL2) and various types of vertical lines (VLn, VL1, VL2) may be disposed in the display panel 11.

In some embodiments, the term "horizontal" and the term "vertical" are used to refer to two directions of the display panel transverse (e.g., perpendicular to) each other; however, it should be noted that the horizontal direction and the vertical direction may be changed depending on a viewing direction. The horizontal direction may refer to, for example, a direction in which one gate line GL is disposed to extend and, and the vertical direction may refer to, for example, a direction in which one data line DL is disposed to extend. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel 110 may include typical vertical lines VLn disposed only in the non-optical area NA, first vertical lines VL1 running through both of the first optical area OA1 and the non-optical area NA, second vertical lines VL2 running through both of the second optical area OA2 and the non-optical area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some embodiments, it should be noted that the term "horizontal" in the second horizontal line HL2 may mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 may include one or more bent or folded portions that are different from the configurations shown in FIGS. 5A and 5B. Likewise, one or more of the first horizontal lines HL1 may also include one or more bent or folded portions.

In some embodiments, it should be noted that the term "vertical" in the typical vertical line VLn may mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, one or more of the typical vertical lines VLn may include one or more bent or folded portions that are different from the configurations shown in FIGS. 5A and 5B. Likewise, one or more of the first vertical line VL1 and one or more of the second vertical line VL2 may also include one or more bent or folded portions.

Referring to FIG. 5A, the first optical area OA1 included in the first horizontal area HA1 may include light emitting areas EA, as shown in FIG. 4, and first transmission areas TA1. In the first optical area OA1, respective outer areas of the first transmission areas TA1 may include corresponding light emitting areas EA.

Referring to FIG. 5A, in order to improve the transmittance of the first optical area OA1, the first horizontal lines HL1 may run through the first optical area OA1 while avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 while avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TA1.

Thus, the first vertical lines VL1 running through the first optical area OA1 and the typical vertical lines VLn disposed in the normal area NA without running through the first optical area OA1 may have different shapes or lengths.

Referring to FIG. 5A, the first transmission areas TA1 included in the first optical area OA1 in the first horizontal area HA1 may be arranged in a diagonal direction.

Referring to FIG. 5A, in the first optical area OA1 in the first horizontal area HAL one or more light emitting areas EA may be disposed between two horizontally adjacent first transmission areas TA1. In the first optical area OA1 in the first horizontal area HAL one or more light emitting areas EA may be disposed between two vertically adjacent first transmission areas TA1.

Referring to FIG. 5A, each of the first horizontal lines HL1 disposed in the first horizontal area HA1 (e.g., each of the first horizontal lines HL1 running through the first optical area OA1) may include one or more curved or bent portions running around one or more respective outer edges of one or more of the first transmission areas TA1.

Referring to FIG. 5B, the second optical area OA2 included in the first horizontal area HA1 may include light emitting areas EA and second transmission areas TA2. In the second optical area OA2, respective outer areas of the second transmission areas TA2 may include corresponding light emitting areas EA.

In one embodiment, the light emitting areas EA and the second transmission areas TA2 in the second optical area OA2 may have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). In this example, a light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom or bottom to top direction). For example, one or more light emitting areas EA may be disposed between two rows of second transmission areas.

When in the first horizontal area HAL running through the second optical area OA2 and the normal area NA adjacent to the second optical area OA2, in one embodiment, the first horizontal lines HL1 may have substantially the same arrangement as the first horizontal lines HL1 of FIG. 5A.

In another embodiment, as shown in FIG. 5B, when in the first horizontal area HAL running through the second optical area OA2 and the normal area NA adjacent to the second optical area OA2, the first horizontal lines HL1 may have an arrangement different from the first horizontal lines HL1 of FIG. 5A.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HAL the first horizontal lines HL1 run through the second optical area OA2 and the normal area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 while avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the typical vertical lines VLn disposed in the normal area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the normal area NA without running through the first optical area OA1 and the second optical area OA2, which is referred to as a second resistance.

Referring to FIGS. 5A and 5B, according to an example light transmitting structure, the first optical area OA1 that at least partially overlaps the first optical electronic device 11 includes the first transmission areas TA1, and the second optical area OA2 that at least partially overlaps with the second optical electronic device 12 includes the second transmission areas TA2. Therefore, the number of subpixels per unit area in each of the first optical area OA1 and the second optical area OA2 may be less than that of the normal area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, may be less than the number of subpixels connected to each, or one or more, of the second horizontal lines HL2 disposed only in the normal area NA without running through the first optical area OA1 and the second optical area OA2, which is referred to as a second number.

A difference between the first number and the second number may vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number may increase.

As described above, since the number (the first number) of subpixels connected to each, or one or more, of the first horizontal lines HL1 running through the first optical area OA1 and the second optical area OA2 is less than the number of subpixels (the second number) connected to each, or one or more, of the second horizontal lines HL2 disposed only in the normal area NA without running through the first optical area OA1 and the second optical area OA2, an area where the first horizontal line HL1 overlaps one or more other electrodes or lines adjacent to the first horizontal line HL1 may be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly less than an RC value of the second horizontal lines HL2 disposed only in the normal area NA without running through the first optical area OA1 and the second optical area OA2, which is referred to as a second RC value. Thus, in this example, the first RC value is greatly smaller than the second RC value (e.g., the first RC value<<the second RC value).

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

Figure 6:
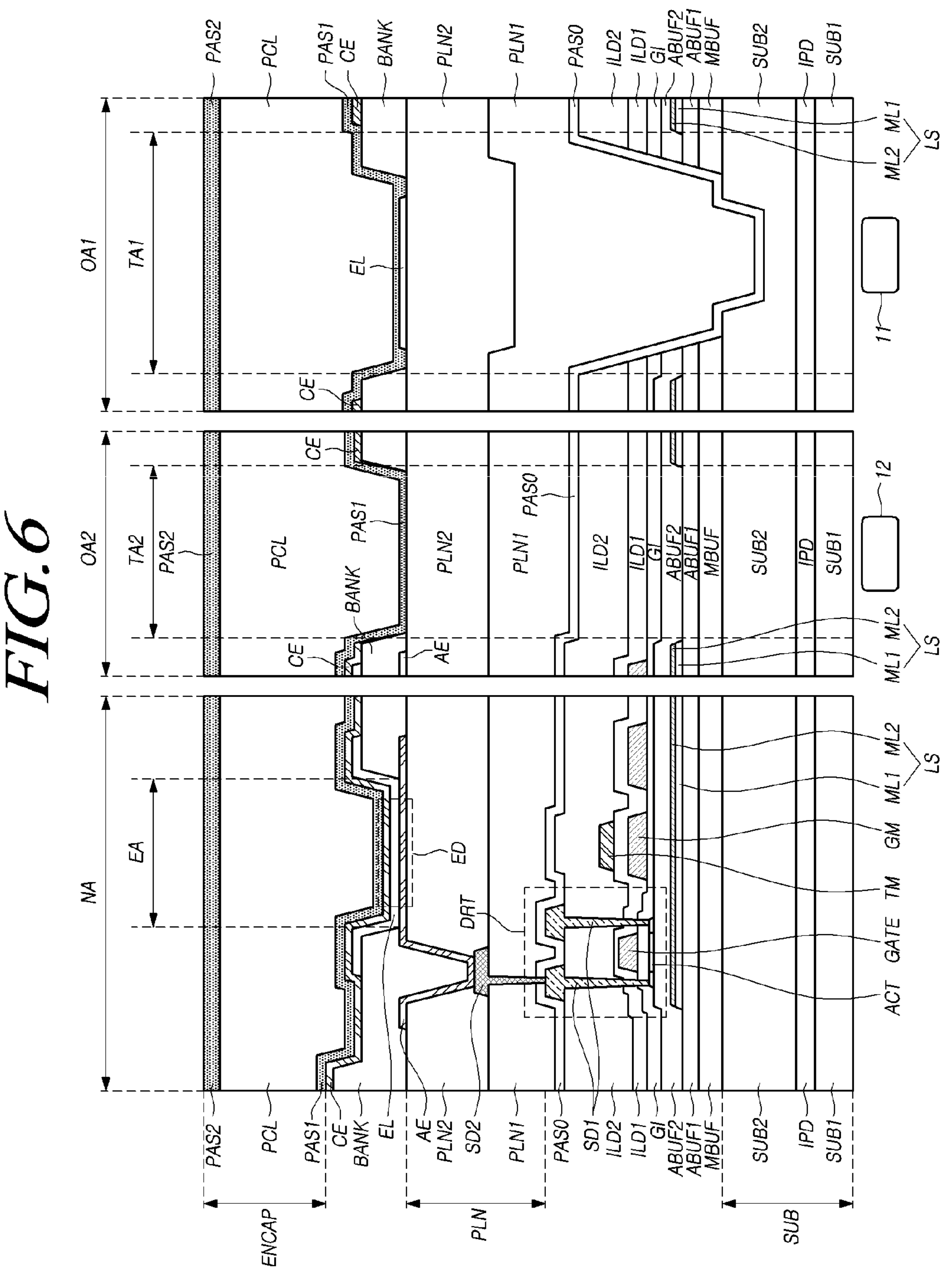
FIGS. 6 and 7 are example cross-sectional views of the normal area, the first optical area, and the second optical area included in the display area of the display panel according to aspects of the present disclosure.
Figure 7:
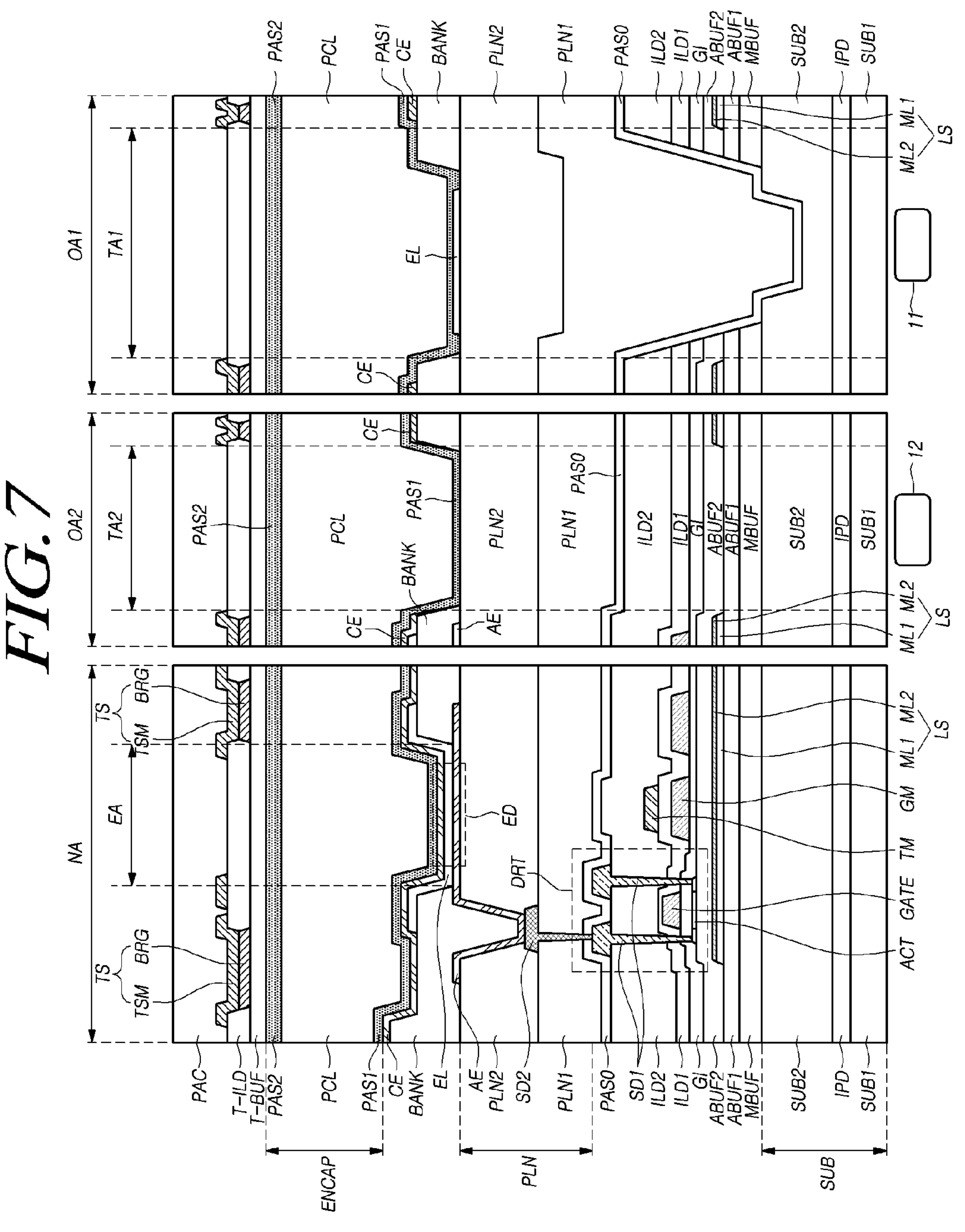

FIGS. 6 and 7 are example cross-sectional views of each of the first optical area OA1, the second optical area OA2, and the non-optical area NA included in the display area DA of the display panel 110 according to aspects of the present disclosure.

FIG. 6 shows the display panel 110 in an example where a touch sensor is implemented outside of the display panel 110 in the form of a touch panel, and FIG. 7 shows the display panel 110 in an example where a touch sensor TS is implemented inside of the display panel 110.

Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA included in the first optical area OA1 and the second optical area OA2 may have the same stack structure as the normal area NA or a light emitting area EA in the normal area NA.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 may be, for example, polyimide (PI) substrates. The first substrate SUB1 may be referred to as a primary PI substrate, and the second substrate SUB2 may be referred to as a secondary PI substrate.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formatted. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planarization layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second planarization layer PLN2.

According to an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corresponding to a light emitting area EA of the subpixel SP may be opened.

A portion of the anode electrode AE may be exposed through the opening (the opened portion) of the bank BANK. An emission layer EL may be positioned on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by including the anode electrode AE, the emission layer EL, and the cathode electrode CE, as described above. The emission layer EL may include an organic material layer.

An encapsulation layer ENCAP may be disposed on the stack of the light emitting element ED. The encapsulation layer ENCAP may have a single-layer structure or a multi-layer structure For example, as shown in FIGS. 6 and 7, the encapsulation layer ENCAP may include a first encapsulation layer PAS1, a second encapsulation layer PCL, and a third encapsulation layer PAS2. The first encapsulation layer PAS1 and the third encapsulation layer PAS2 may be, for example, an inorganic material layer, and the second encapsulation layer PCL may be, for example, an organic material layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can minimize, reduce or prevent external moisture or oxygen from penetrating into the first encapsulation layer PAS1 and the second encapsulation layer PCL. For example, the third encapsulation layer PAS2 may include an inorganic insulating material, such as silicon nitride (SiNx), silicon oxide (SiOx), silicon oxynitride (SiON), aluminum oxide (Al2O3), or the like.

Referring to FIG. 7, in an example where a touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP. The touch sensor TS may be disposed on the touch buffer layer T-BUF.

The touch sensor TS may include touch sensor metals TSM and at least one bridge metal BRG, which are located in different layers. A touch interlayer insulating layer T-ILD may be disposed between the touch sensor metals TSM and the bridge metal BRG. For example, the touch sensor metals TSM may include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (e.g., a developer or etchant) used in the corresponding process or moisture from the outside may be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

In order to prevent damage to the emission layer EL including an organic material, which is vulnerable to high temperatures, the touch buffer layer T-BUF can be formed at a low temperature less than or equal to a predetermined or selected temperature (e.g. 100 degrees (° C.)) and be formed using an organic insulating material having a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

Next, a stack structure of the first optical area OA1 will be described with reference to FIGS. 6 and 7.

Referring to FIGS. 6 and 7, the light emitting area EA of the first optical area OA1 may have the same stack structure as that in the normal area NA. Accordingly, in the discussion that follows, instead of repeatedly describing the light emitting area EA in the first optical area OA1, a stack structure of the first transmission area TA1 in the first optical area OA1 will be described in detail below.

In some embodiments, the cathode electrode CE may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the cathode electrode CE.

Further, in some embodiments, a light shield layer LS including at least one of the first metal layer ML1 and the second metal layer ML2 may be disposed in the light emitting areas EA included in the normal area NA and the first optical area OA1, but may not be disposed in the first transmission area TA1 in the first optical area OA1. For example, the first transmission area TA1 in the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 may be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Further, referring to FIGS. 6 and 7, in some embodiments, the anode electrode AE and the cathode electrode CE included in the light emitting element ED may not be disposed in the first transmission area TA1. In some embodiments, the emission layer EL of the light emitting element ED may or may not be disposed in the first transmission area TA1 according to a design requirement or one or more design parameters.

Further, referring to FIG. 7, in some embodiments, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light transmitting through the first transmission area TA1.

In some embodiments, since all, or one or more, of the first transmission area TA1 in the first optical area OA1 overlap the first optical electronic device 11, to enable the first optical electronic device 11 to normally operate, it is desired to further increase a transmittance of the first transmission area TA1 in the first optical area OA1.

To achieve the foregoing, in the display panel 110 of the display device 100 according to aspects of the present disclosure, a transmittance improvement structure TIS can be provided to the first transmission area TA1 in the first optical area OA1.

Referring to FIGS. 6 and 7, the plurality of insulating layers included in the display panel 110 may include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

Referring to FIG. 7, the plurality of insulating layers included in the display panel 110 may further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS.

Referring to FIGS. 6 and 7, among the plurality of insulating layers, the first planarization layer PLN1 may include at least one depression (e.g., a recess, a trench, a concave portion, a protrusion, or the like). The first planarization layer PLN1 may be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 may also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof. The second encapsulation layer PCL may be, for example, an organic insulating layer.

Referring to FIG. 7, to protect the touch sensor TS, the protective layer PAC may be disposed to cover the touch sensor TS on the encapsulation layer ENCAP.

Referring to FIG. 7, the protective layer PAC may have at least one depression (e.g., a recess, a trench, a concave portion, a protrusion, or the like) as a transmittance improvement structure TIS in a portion overlapping the first transmission area TA1. The protective layer PAC may be, for example, an organic insulating layer.

Referring to FIG. 7, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the subpixel SP.

In order for the first optical area OA1 to have a transmittance greater than the normal area NA, an area or size of the touch sensor metal TSM per unit area in the first optical area OA1 may be smaller than an area or size of the touch sensor metal TSM per unit area in the normal area NA.

Referring to FIG. 7, in some embodiments, the touch sensor TS may be disposed in the light emitting area EA in the first optical area OA1, but may not be disposed in the first transmission area TA1 in the first optical area OA1.

Next, a stack structure of the second optical area OA2 will be described with reference to FIGS. 6 and 7.

Referring to FIGS. 6 and 7, the light emitting area EA of the second optical area OA2 may have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE may be disposed in the light emitting areas EA included in the normal area NA and the second optical area OA2, but may not be disposed in the second transmission area TA2 in the second optical area OA2. For example, the second transmission area TA2 in the second optical area OA2 may be corresponded to an opening of the cathode electrode CE.

Further, in some embodiments, a light shield layer LS including at least one of the first metal layer ML1 and the second metal layer ML2 may be disposed in the light emitting areas EA included in the normal area NA and the second optical area OA2, but may not be disposed in the first transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 may be different at least in part from as the stacked structure of the first transmission area TA1 in the first optical area OA1.

For example, as shown in FIGS. 6 and 7, in some embodiments, when the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. Further, a width of the second transmission area TA2 in the second optical area OA2 may be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 may be disposed in the second transmission area TA2 in the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, in some embodiments, the anode electrode AE and the cathode electrode CE included in the light emitting element ED may not be disposed in the second transmission area TA2. In some embodiments, the emission layer EL of the light emitting element ED may or may not be disposed on the second transmission area TA2 according to a design requirement or one or more design parameters.

Further, referring to FIG. 7, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
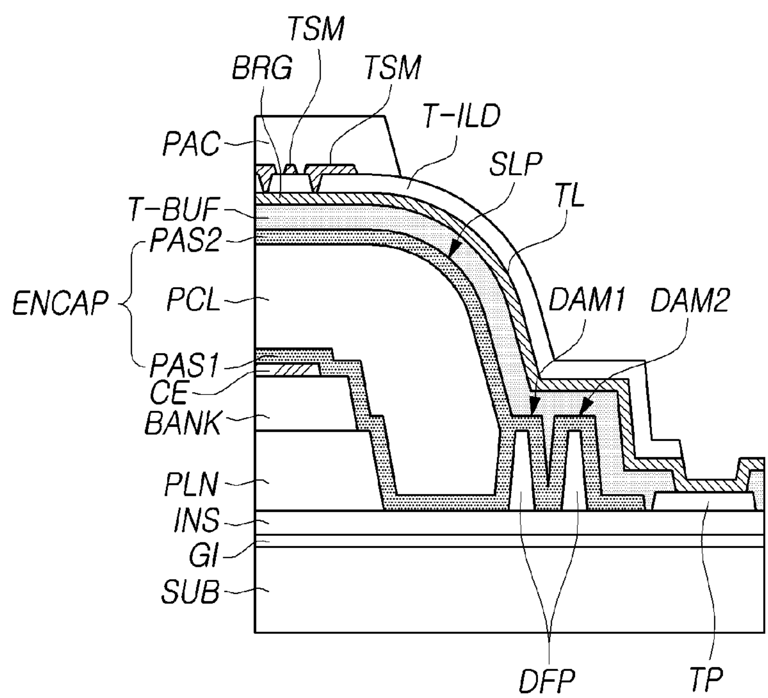
FIG. 8 is an example cross-sectional view in an outer edge of the display panel according to aspects of the present disclosure.

FIG. 8 is an example cross-sectional view in an outer edge of the display panel according to aspects of the present disclosure.

Figure 9:
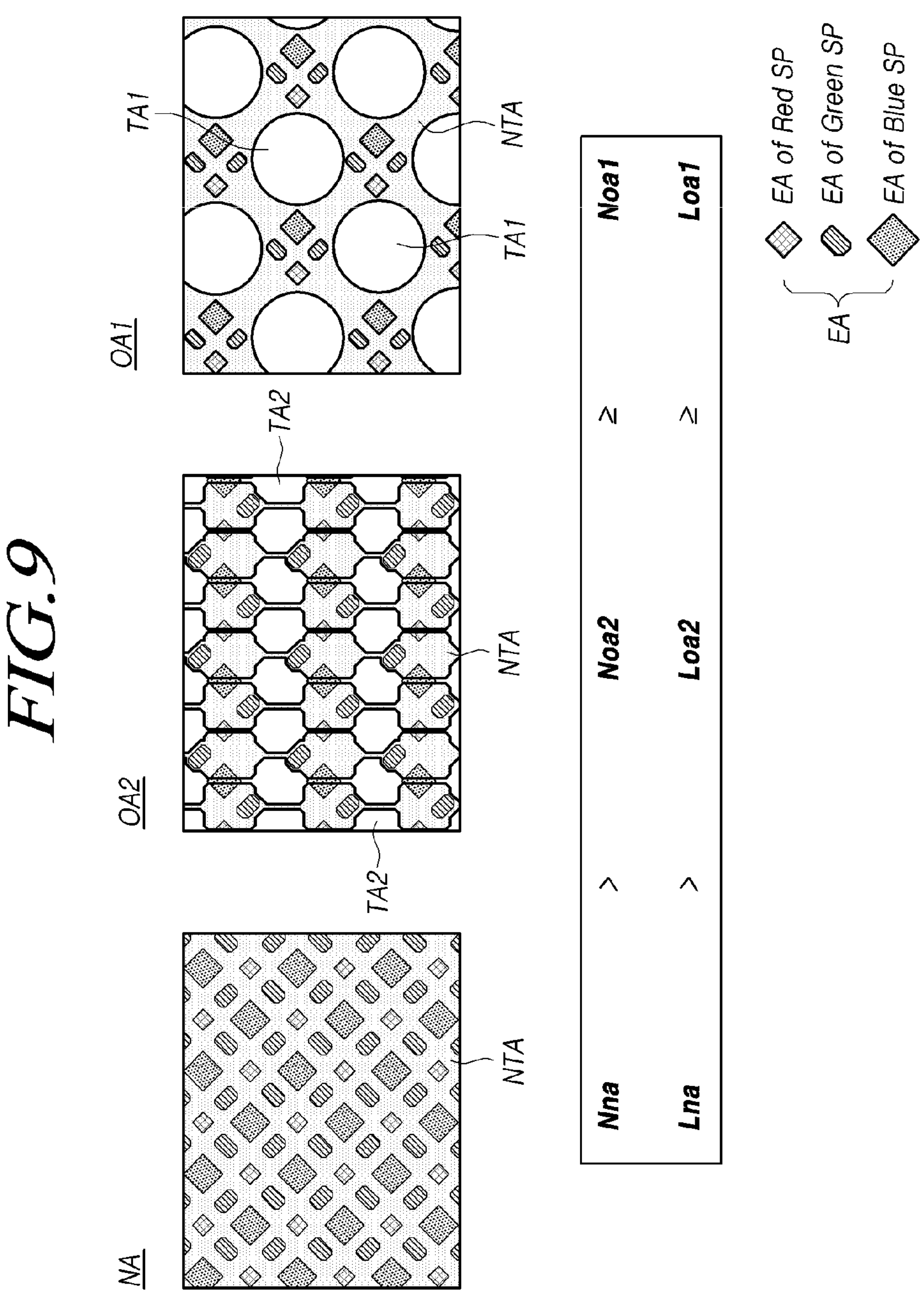
FIG. 9 illustrates a difference in luminance between the normal area, the first optical area, and the second optical area in the display device according to aspects of the present disclosure.

For the sake of brevity, in FIG. 8, a single substrate SUB including the first substrate SUB1 and the second substrate SUB2 is illustrated, and layers or portions located under the bank BANK are illustrated in a simplified manner. Likewise, FIG. 9 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1. The third encapsulation layer PAS2 may be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can minimize, reduce or prevent external moisture or oxygen from penetrating into the first encapsulation layer PAS1 and the second encapsulation layer PCL.

Referring to FIG. 8, in order to prevent the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1, DAM2) may be present at, or near to, a boundary point between the display area DA and the non-display area NDA. The one or more dams (DAM1, DAM2) may include the same material DFP as the bank BANK.

Referring to FIG. 8, in one embodiment, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1, DAM2). In another embodiment, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another embodiment, the second encapsulation layer PCL may extend past the upper portion of the first dam DAM1 and extend up to all, or at least a portion of, an upper portion of the secondary dam DAM2.

Referring to FIG. 8, a touch pad TP, to which the touch driving circuit 260, as shown in FIG. 2, is electrically connected, may be disposed on a portion of the substrate SUB outside of the one or more dams (DAM1, DAM2). A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP. The touch line TL may run downward along the inclined surface SLP of the encapsulation layer ENCAP, run along the respective upper portions of the dams (DAM1, DAM2), and extend up to the touch pad TP disposed outside of the dams (DAM1, DAM2).

Referring to FIG. 8, in one embodiment, the touch line TL may be the bridge metal BRG. In another embodiment, the touch line TL may be the touch sensor metal TSM.

FIG. 9 illustrates a difference in luminance between the normal area NA, the first optical area OA1, and the second optical area OA2 in the display device 100 according to aspects of the present disclosure.

Referring to FIG. 9, among the non-optical area NA, the first optical area OA1, and the second optical area OA2 included in the display area DA of the display device 100, the first optical area OA1 and the second optical area OA2 include the first transmission areas TA1 and the second transmission areas TA2, respectively. In an embodiment, the number of subpixels Noa1 per unit area in the first optical areas OA1 and the number of subpixels Noa2 per unit area in the second optical areas OA2 may be less than the number of subpixels per unit area in the normal area NA.

The number of subpixels per unit area may have the same meaning as density of subpixels, or a degree of integration of subpixels. For example, the number of subpixels per unit area can be measured using subpixels per inch (PPI). The greater the number of subpixels per unit area is, the higher the resolution may be, and the less the number of subpixels per unit area is, the lower the resolution may be.

Referring to FIG. 9, for example, in an example where at least a portion of the first optical area OA1 overlaps the first optical electronic device 11, and at least a portion of the second optical area OA2 overlaps the second optical electronic device 12, the first optical electronic device 11 may need an amount of received light similar to or greater than an amount of received light that the second optical electronic device 12 needs.

In this example, the number of subpixels Noa1 per unit area in the first optical area OA1 may be less than or equal to the number of subpixels Noa2 per unit area in the second optical area OA2, and the number of subpixels Noa2 per unit area in the second optical area OA2 may be less than the number of subpixels Nna per unit area in the normal area NA, and the number of subpixels Noa1 per unit area in the first optical area OA1 may be less than the number of subpixels Nna per unit area in the normal area NA (e.g., Nna>Noa2≥Noa1).

As described above, due to a difference in the number of subpixels per unit area between the normal area NA, the first optical area OA1, and the second optical area OA2, even though subpixels SP disposed in the normal area NA, subpixels SP disposed in the first optical area OA1, and subpixels SP disposed in the second optical area OA2 receive a data voltage Vdata equal in magnitude, there may occur differences between the luminance Lna of the normal area NA, the luminance Loa1 of the first optical area OA1, and the luminance Loa2 of the second optical area OA2.

Referring to FIG. 9, for example, in an example where the number of subpixels Nna per unit area in the normal area NA is greater than the number of subpixels Noa1 per unit area in the first optical area OA1 and the number of subpixels Noa2 per area unit in the second optical area OA2, and the number of subpixels Noa2 per area unit in the second optical area OA2 is greater than or equal to the number of subpixels Noa1 per unit area in the first optical area OA1 (e.g., Nna>Noa2≥Noa1), the luminance Lna of the normal area NA may be greater than the luminance Loa1 of the first optical area OA1 and the luminance Loa2 of the second optical area OA2, and the luminance Loa2 of the second optical area OA2 may be greater than or equal to the luminance Loa1 of the first optical area OA1 (e.g., Lna>Loa2≥Loa1).

As described above, since the first optical area OA1 and the second optical area OA2 include the first transmission areas TA1 and the second transmission areas TA2, respectively, differences in luminance (e.g., luminance non-uniformity) between the areas (NA, OA1, and OA2) in the display area DA may occur, this may cause image quality to be degraded.

To address these issues, in some embodiments, a luminance difference compensation technique is provided for reducing or eliminating differences in luminance (luminance non-uniformity) between the areas (NA, OA1, and OA2) in the display area DA.

The luminance difference compensation technique according to embodiments of the present disclosure may include a first luminance difference compensation technique, which is a structure-based technique, and a second luminance difference compensation technique, which is a driving-based technique.

The first luminance difference compensation technique is a technique of reducing differences in luminance between the optical areas OA1 and OA2 and the normal area NA through the application of a compensation capacitor as a luminance difference compensation structure to the inside of subpixels SP of the optical areas OA1 and OA2.

The second luminance difference compensation technique is a technique of reducing differences in luminance between the optical areas OA1 and OA2 and the normal area NA through the using of different gamma curves for data driving for subpixels SP of the optical areas OA1 and OA2 and for data driving for subpixels SP of the normal area NA.

Hereinafter, the luminance difference compensation techniques according to embodiments of the present disclosure will be described in further detail. For convenience of description, the luminance difference compensation technique according to embodiments of the present disclosure will be discussed with respect to subpixels SP of the first optical area OA1 that has the smallest number of subpixels per unit area, and may therefore result in the greatest decrease in luminance, among the first and second optical areas OA1 and OA2 and the normal area NA.

In embodiments where the first luminance difference compensation technique is applied, the technique of using different gamma curves according to the second luminance difference compensation technique may not be applied.

In embodiments where the second luminance difference compensation technique is applied, the technique of applying a compensation capacitor according to the first luminance difference compensation technique may not be applied.

Hereinafter, the first luminance difference compensation technique according to embodiments of the present disclosure will be described with reference to FIGS. 10 and 11, and the second luminance difference compensation technique according to embodiments of the present disclosure will be described with reference to FIGS. 12, 13A, and 13B.

Figure 10:
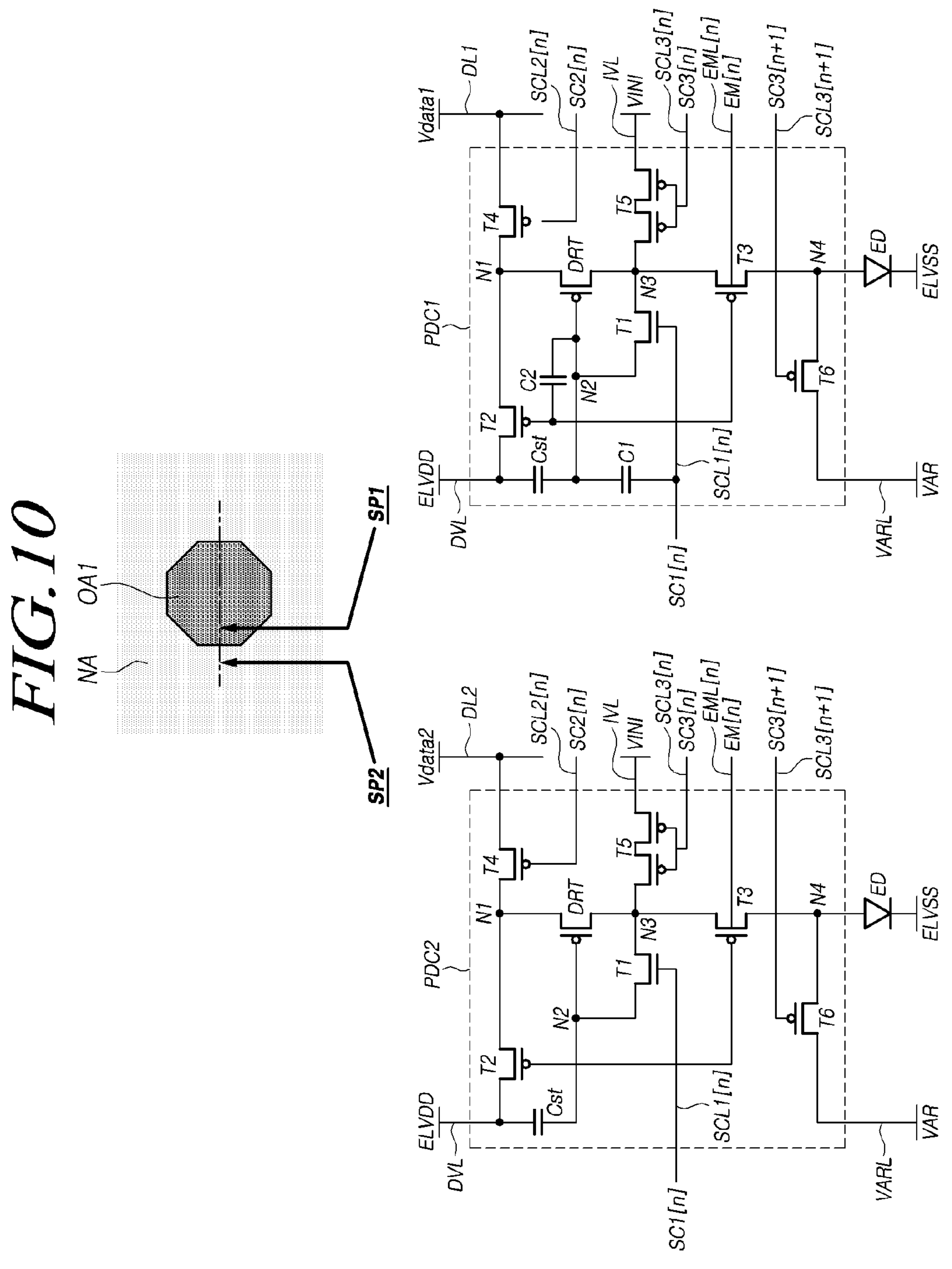
FIG. 10 illustrates an example equivalent circuit of a first subpixel in the first optical area and an example equivalent circuit of a second subpixel in the normal area, in the display device according to aspects of the present disclosure.

FIG. 10 illustrates an example equivalent circuit of a first subpixel SP1 in a first optical area (e.g., the first optical area OA1 in the figures discussed above) and an example equivalent circuit of a second subpixel SP2 in a normal area (e.g., the normal area NA in the figures discussed above) in the display device 100 according to aspects of the present disclosure.

Referring to FIG. 10, a display area DA for displaying an image in the display panel 110 may include the first optical area OA1 and the normal area NA surrounding the first optical area OA1. Among a plurality of subpixels SP disposed in the display area DA, the first subpixel SP1 may be disposed in the first optical area OA1, and the second subpixel SP2 may be disposed in the normal area NA. It should be understood that "surrounding" includes the meaning of being fully or partially surrounded. For example, in FIG. 10, the first optical area OA1 is laterally surrounded and vertically exposed by the normal area NA. In the example of FIG. 10, the first optical area OA1 has octagonal shape, and as such, may be surrounded on at least eight sides by the normal area NA. In embodiments in which the first optical area OA1 has a circular shape, the normal area NA may surround the first optical area OA1 on one side (e.g., the lateral side).

Referring to FIG. 10, each of the plurality of subpixels SP including the first subpixel SP1 and the second subpixel SP2 may include a first node N1, a second node N2, a third node N3, and a fourth node N4, which are basically main nodes.

Referring to FIG. 10, each of the plurality of subpixels SP including the first subpixel SP1 and the second subpixel SP2 may basically include a light emitting element ED and a pixel driving circuit for driving the light emitting element ED. The pixel driving circuit of each of the plurality of subpixels SP may basically include seven transistors (DRT, T1 to T6) and one capacitor Cst.

Referring to FIG. 10, the light emitting element EP included in each of the plurality of subpixels SP may be connected to the fourth node N4 in each of the plurality of subpixels SP.

Referring to FIG. 10, each of a first pixel driving circuit PDC1 of the first subpixel SP1 and a second pixel driving circuit PDC2 of the second subpixel SP2 may have a basic common structure including a driving transistor DRT, six transistors (T1 to T6), and one storage capacitor Cst.

The driving transistor DRT can be controlled by a voltage at the second node N2 and can drive the light emitting element EP. The first transistor T1 can be turned on or turned off by a first scan signal SC1[*n*] supplied through a first scan line SCL1[*n*], and can control a connection between the second node N2 and the third node N3. The second transistor T2 can be turned on or turned off by an emission control signal EM[n] supplied through an emission control line EML[n], and can control a connection between the first node N1 and a driving voltage line DVL. The third transistor T3 can be turned on or turned off by the emission control signal EM[n], and can control a connection between the third node N3 and the fourth node N4.

Referring to FIG. 10, the first node N1 may correspond to the source node (or the drain node) of the driving transistor DRT. The second node N2 may correspond to the gate node of the driving transistor DRT. The third node N3 may correspond to the drain node (or the source node) of the driving transistor DRT. The fourth node N4 may correspond to the anode electrode AE of the light emitting element ED.

Referring to FIG. 10, each of the first pixel driving circuit PDC1 of the first subpixel SP1 and the second pixel driving circuit PDC2 of the second subpixel SP2 may further include a fourth transistor T4 for controlling a connection between the first node N1 and a data lines DL, a fifth transistor T5 for controlling a connection between the third node N3 or the second node N2 and a first initialization line IVL, a sixth transistor T6 for controlling a connection between the fourth node N4 and a second initialization line VARL, and a storage capacitor Cst between the second node N2 and the driving voltage line DVL.

The fourth transistor T4 can be turned on or turned off by a second scan signal SC2(*n*) supplied through a second scan line SCL2(*n*). When the second scan signal SC2[*n*] has a turn-on level voltage, a first data voltage Vdata1 transmitted through a first data line DL1 can be supplied to the first node N1 of the first subpixel SP1 through the fourth transistor T4 turned on in the first subpixel SP1, and a second data voltage Vdata2 transmitted through a second data line DL2 can be supplied to the first node N1 of the second subpixel SP2 through the fourth transistor T4 turned on in the second subpixel SP2.

The fifth transistor T5 can be turned on or turned off by a third scan signal SC3(*n*) supplied through a third scan line SCL3(*n*). When the fifth transistor T5 is turned on by a turn-on level voltage of the third scan signal SC3[*n*], a first initialization voltage VINI supplied from the first initialization line IVL may be applied to the third node N3 through the turned-on fifth transistor T5. The fifth transistor T5 may include two partial transistors. A gate node of each of the two partial transistors may be commonly connected to the third scan line SCL3[*n*].

The sixth transistor T6 can be turned on or turned off by a third scan signal SC3[*n*+1] of another stage supplied through a third scan line SCL3[*n*+1] of the another stage. When the sixth transistor T6 is turned on by a turn-on level voltage of the third scan line SCL3[*n*+1] of the another stage, a second initialization voltage VAR transmitted through the second initialization line VARL may be applied to the fourth node N4 through the turned-on sixth transistor T6. The fourth node N4 may a node electrically corresponded to the anode electrode AE of the light emitting element ED. As shown in FIG. 11, among the seven transistors (DRT and T1 to T6), the first transistor T1 may be an n-type transistor, and the driving transistor DRT and the second to sixth transistors T2 to T6 may be p-type transistors.

In the example of FIG. 10, among the seven transistors (DRT and T1 to T6), the first transistor T1 may be an n-type transistor, and the second transistor T2 and the third transistor T3 may be p-type transistors. The remaining transistors (DRT, T4, T5, and T6) may be n-type or p-type transistors.

The first scan signal SC1[*n*], the second scan signal SC2[*n*], and the third scan signal SC3[*n*], and the emission control signal EM[n] may be applied, as gate signals, to the gate nodes of the six transistors (T1 to T6).

In the case of n-type transistor, a turn-on level voltage of a gate signal applied to the gate node of the transistor may be a high level voltage, and a turn-off level voltage of the gate signal applied to the gate node of the transistor may be a low level voltage.

In the case of p-type transistor, a turn-on level voltage of a gate signal applied to the gate node of the transistor may be a low level voltage, and a turn-off level voltage of the gate signal applied to the gate node of the transistor may be a high level voltage.

Referring to FIG. 10, according to the first luminance difference compensation technique according to embodiments of the present disclosure, in order to reduce or eliminate a difference in luminance between the first optical area OA1 and the normal area NA, the first subpixel SP1 disposed in the first optical area OA1 may include a luminance difference compensation structure.

Referring to FIG. 10, the luminance difference compensation structure included in the first subpixel SP1 disposed in the first optical area OA1 may include at least one of a first compensation capacitor C1 between the second node N2 and the first scan line SCL1[*n*] and a second compensation capacitor C2 between the second node N2 and the emission control line EML[n]. For example, the luminance difference compensation structure included in the first subpixel SP1 disposed in the first optical area OA1 may include only the first compensation capacitor C1, include only the second compensation capacitor C2, or include both the first compensation capacitor C1 and the second compensation capacitor C2.

Referring to FIG. 10, according to the first luminance difference compensation technique according to embodiments of the present disclosure, in the first subpixel SP1 disposed in the first optical area OA1, the second node N2 may be capacitively coupled to at least one of the first scan line SCL1[*n*] and the emission control line EML[n].

Referring to FIG. 10, the first compensation capacitor C1 may be formed through the overlapping of the second node N2 or a first connection pattern corresponding thereto with the first scan line SCL1[*n*]. The second compensation capacitor C2 may be formed through the overlapping of the second node N2 or the first connection pattern corresponding thereto with the emission control line EML[n].

As the luminance difference compensation structure is applied, the first subpixel SP1 disposed in the first optical area OA1 can emit light brighter than the second subpixel SP2 disposed in the normal area NA and not having the luminance difference compensation structure. For example, the luminance of the first subpixel SP1 disposed in the first optical area OA1 may be greater than that of the second subpixel SP2 disposed in the normal area NA.

Accordingly, although the first optical area OA1 has a smaller number of subpixels Noa1 per unit area, as luminance of each of the first subpixels SP1 included in the first optical area OA1 increases, the overall luminance Loa of the first optical area OA1 can increase. A level of the increased luminance Loa of the first optical area OA1 may be equal or similar to that of the overall luminance Lna of the normal area NA.

Hereinafter, in order to reduce a difference in luminance between the first optical area OA1 and the normal area NA according to the first luminance difference compensation technique according to embodiments of the present disclosure, a method and principle for increasing the luminance of the first subpixel SP1 disposed in the first optical area OA1 will be described in further detail with reference to FIG. 11.

Figure 11:
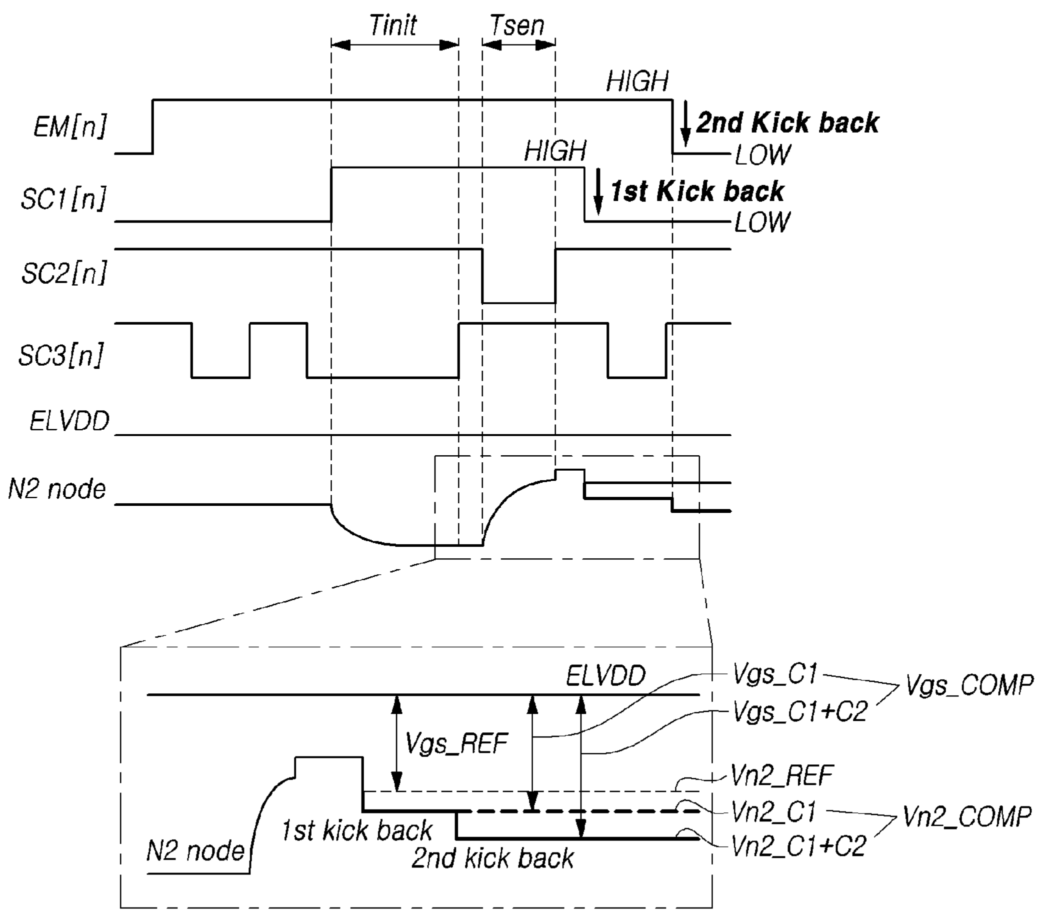
FIG. 11 is an example driving timing diagram of the first subpixel of the first optical area in the display device according to aspects of the present disclosure.

FIG. 11 is an example driving timing diagram of a first subpixel (e.g., the first subpixel SP1 in the figures discussed above) of a first optical area (e.g., the first optical area OA1 in the figures discussed above) in the display device 100 according to aspects of the present disclosure. The driving timing diagram of FIG. 11 may be, for example, based on the circuit of FIG. 10.

The driving timing diagram of FIG. 11 shows an emission control signal EM[n], a first scan signal SC1[*n*], a second scan signal SC2[*n*], a third scan signal SC3[*n*], a driving voltage EVLDD, and a voltage at the second node N2.

Referring to FIG. 11, in the display device 100 according to aspects of the present disclosure, the second node N2 of the first subpixel SP1 disposed in the first optical area OA1 may be capacitively coupled to at least one of the first scan line SCL1[*n*] and the emission control line EML[n]. Due to this configuration, a kickback on the second node N2 may occur at a kickback timing.

Referring to FIG. 11, as a kickback of a voltage at the second node N2 occurs in a negative voltage direction (i.e., a direction in which a voltage decreases to a lower level of voltage), the voltage at the second node N2 corresponding to the gate node of the driving transistor DRT may fall to a lower level. Accordingly, a gate-source potential difference Vgs, which is a voltage difference between a gate voltage and a source voltage of the driving transistor DRT, may increase. Thereby, the driving transistor DRT of the first subpixel SP1 can supply a more amount of driving current to the light emitting element ED.

In turn, the luminance of the first subpixel SP may increase, and therefore, a level of the overall luminance Loa1 of the first optical area OA1 may be similar to that of the luminance Lna of the normal area NA. That is, a difference in luminance between the first optical area OA1 and the normal area NA may be compensated for.

Referring to FIG. 11, a driving period of the first subpixel SP1 may include an initialization period Tini and a sensing period Tsen.

Referring to FIG. 11, during the initialization period Tini, the first scan signal SC1[*n*] may be changed from a low level voltage (e.g., a turn-off level voltage) to a high level voltage (e.g., a turn-on level voltage). Thereby, during the initialization period Tini, the first transistor T1 can be turned on. In turn, the second node N2 and the third node N3 can be electrically connected. That is, the gate node and the drain node (or the source node) of the driving transistor DRT can be electrically connected as a diode connection.

During the initialization period Tini, the third scan signal SC3[*n*] may have a low level voltage (e.g., a turn-on level voltage). Thereby, the fifth transistor T5 can be turned on.

During the initialization period Tini, a first initialization voltage VINI transmitted through the first initialization line IVL may be applied to the second node N2 through the turned-on fifth transistor T5 and the turned-on first transistor T1.

Since the first initialization voltage VINI may have a low level voltage, the driving transistor DRT can be turned on by the first initialization voltage VINI applied to the second node N2.

Referring to FIG. 11, during the sensing period Tsen, the second scan signal SC2[*n*] may be changed from a high level voltage (e.g., a turn-off level voltage) to a low level voltage (e.g., a turn-on level can be turned on. Thereby, during the sensing period, a first data voltage Vdata1 transmitted through the first data line DL1 can be applied to the first node N1 through the turned-on fourth transistor T4. In this situation, the driving transistor DRT may be in the turned-on state. This is because the first initialization voltage VINI has continually been applied to the second node N2 after the first initialization voltage VINI was applied through the first initialization line IVL to the second node N2 in the initialization period Tini.

During the sensing period Tsen, since the first scan signal SC1[n] has the high level voltage (e.g., the turn-on level voltage), the first transistor T1 is in the turned-on state. In turn, the second node N2 and the third node N3 can be electrically connected. That is, the gate node and the drain node (or the source node) of the driving transistor DRT can be electrically connected as a diode connection.

During the sensing period Tsen, the second node N2 corresponding to the gate node of the driving transistor DRT can have a voltage value (Vdata1+Vth) obtained by adding the first data voltage Vdata1 and the threshold voltage Vth of the driving transistor DRT.

Referring to FIG. 11, a kickback timing during the driving period of the first subpixel SP1 may include one or more of a first timing Tkb1 in which the first scan signal SC1[n] is changed from the high level voltage to the low level voltage and a second timing Tkb2 in which the emission control signal EM[n] is changed from a high level voltage to a low level voltage.

The first timing Tkb1 may be a timing related to the first compensation capacitor C1, and be a timing at which a first kickback may occur. The second timing Tkb2 may be a timing related to the second compensation capacitor C2, and be a timing at which a second kickback may occur. The second timing Tkb2 may proceed after the first timing Tkb1.

Referring to FIG. 11, the first timing Tkb1 may be a timing at which a voltage level of the first scan signal SC1[n] is changed after the sensing period Tsen. The second timing Tkb2 may be a timing at which a voltage level of the emission control signal EM[n] is changed after the first timing Tkb1.

In an example where the first subpixel SP1 includes both the first compensation capacitor C1 and the second compensation capacitor C2, both the first kickback and the second kickback may occur. In an example where the first subpixel SP1 includes only the first compensation capacitor C1, only the first kick may occur. In an example where the first subpixel SP1 includes only the second compensation capacitor C2, only the second kick may occur.

Referring to FIG. 11, the driving voltage ELVDD may be a voltage applied to the source node of the driving transistor DRT. The source node of the driving transistor DRT may correspond to the first node N1.

Referring to FIG. 11, at the first kickback timing Tkb1 at which the first kickback occurs, as a voltage across the first scan line SCL1[n] to which the first scan signal SC1[n] is supplied is changed from the high level voltage HIGH to the level voltage LOW, a voltage at the second node N2 forming the first compensation capacitor C1 together with the first scan line SCL1[n] may also fall to a lower level. Here, a falling width of the voltage at the second node N2 may depend on a voltage variance width HIGH-LOW of the first scan signal SC1(n). The term "voltage variance width" may refer to magnitude of a voltage drop or voltage increase from a first voltage to a second voltage. For example, the voltage variance width of the first scan signal SC1[n] shown in FIG. 11 may be equal to the high level voltage HIGH minus the low level voltage LOW.

Referring to FIG. 11, the decreased voltage Vn2_COMP at the second node N2 by the first kickback may be a first kickback gate voltage Vn2_C1. Accordingly, a voltage difference Vgs_COMP between the gate voltage and the source voltage of the driving transistor DRT may be a first kickback gate-source potential difference Vgs_C1.

Referring to FIG. 11, since the second subpixel SP2 of the normal area NA may not include the first compensation capacitor C1, the first kickback may not occur in the second subpixel SP2 of the normal area NA. Accordingly, when the second subpixel SP2 of the normal area NA is driven, a voltage at the second node N2 in the second subpixel SP2 may be a reference gate voltage Vn2_REF, and a voltage difference between the gate voltage and the source voltage of the driving transistor DRT in the second subpixel SP2 may be a reference gate-source potential difference Vgs_REF.

Referring to FIG. 11, the first kickback gate-source potential difference Vgs_C1, which is the voltage difference Vgs_COMP between the gate voltage and the source voltage of the driving transistor DRT in the first subpixel SP1, when the first kickback occurs, may be much greater than the reference gate-source potential difference Vgs_REF, which is the voltage difference between the gate voltage and the source voltage of the driving transistor DRT in the second subpixel SP2, when the first kickback does not occur.

Referring to FIG. 11, at the second timing Tkb2 at which the second kickback occurs after the first kickback, as a voltage across the emission control line EML[n] to which the emission control signal EM[n] is supplied is changed from the high level voltage HIGH to the level voltage LOW, a voltage at the second node N2 forming the second compensation capacitor C2 together with the emission control line EML[n] may also fall to a lower level. Here, a falling width of the voltage at the second node N2 may depend on a voltage variance width HIGH-LOW of the emission control line EML[n].

The decreased voltage Vn2_COMP at the second node N2 in the first subpixel SP1 by the second kickback may be a second kickback gate voltage Vn2_C1+C2. Accordingly, a voltage difference Vgs_COMP between the gate voltage and the source voltage of the driving transistor DRT in the first subpixel SP1 may be a second kickback gate-source potential difference Vgs_C1+C2.

Referring to FIG. 11, since the second subpixel SP2 of the normal area NA may not include the first compensation capacitor C1, the second kickback may not occur in the second subpixel SP2 of the normal area NA. Accordingly, when the second subpixel SP2 of the normal area NA is driven, a voltage at the second node N2 in the second subpixel SP2 may be the reference gate voltage Vn2_REF, and a voltage difference between the gate voltage and the source voltage of the driving transistor DRT in the second subpixel SP2 may be the reference gate-source potential difference Vgs_REF.

Referring to FIG. 11, the second kickback gate-source potential difference Vgs_C1+C2, which is the voltage difference Vgs_COMP between the gate voltage and the source voltage of the driving transistor DRT in the first subpixel SP1, when the second kickback consecutively occurs after the first kickback, may be much greater than the reference gate-source voltage difference Vgs_REF, which is the voltage difference between the gate voltage and the source voltage of the driving transistor DRT in the second subpixel SP2, when both the first kickback and the second kickback do not occur.

In some embodiments, the first subpixel SP1 of the first optical area OA1 and the second subpixel SP2 of the normal area NA may be disposed in the same row, and be disposed in the same column or in different columns. For example, the first subpixel SP1 may be supplied with the first data voltage Vdata1 through the first data line DL1, and the second subpixel SP2 may be supplied with the second data voltage Vdata2 through the second data line DL2 or the first data line DL1. When the first data voltage Vdata1 is equal to the second data voltage Vdata2, a voltage difference (Vgs_COMP: Vgs_C1, Vgs_C2 or Vgs_C1+C2) between the gate voltage and the source voltage of the driving transistor DRT during an emission period S8 of the first subpixel SP1 may be greater than the voltage difference Vgs_REF between the gate voltage and the source voltage of the driving transistor DRT during an emission period S8 of the second subpixel SP2.

As the compensation capacitors C1 and C2 are formed in first subpixel SP1 disposed in first optical area OA1, and kickback occurs on the gate voltage of the driving transistor DRT in first subpixel SP1 by the compensation capacitors C1 and C2, the voltage difference (Vgs_COMP: Vgs_C1, Vgs_C2 or Vgs_C1+C2) between the gate voltage and the source voltage of the driving transistor DRT in the first subpixel SP1 may increase.

Accordingly, even when the first data voltage Vdata1 supplied to the first subpixel SP1 disposed in the first optical area OA1 is equal to the second data voltage Vdata2 supplied to the second subpixel SP2 disposed in the normal area NA, the first subpixel SP1 disposed in the first optical area OA1 can emit light relatively brighter than the second subpixel SP2 disposed in the normal area NA.

As a result, a level of the overall luminance Loa1 of the first optical area OA1 having a small number of subpixels per unit area may be similar to that of the overall luminance Lna of the normal area NA having a large number of subpixels per unit area. That is, although the total number of first subpixels SP1 included in the first optical area OA1 is relatively small, since each first subpixel SP1 of the first optical area OA1 emits light brighter; therefore, a level of the overall luminance Loa1 of the optical area OA1 can be similar to that of the overall luminance Lna of the normal area NA. As described above, according to the first luminance difference compensation technique, even when the first data voltage Vdata supplied to the first subpixel SP1 disposed in the first optical area OA1 is equal to the second data voltage Vdata supplied to the second subpixel SP2 disposed in the normal area NA, a difference between the luminance Loa1 of the first optical area OA1 and the luminance Lna of the normal area NA may be less than a difference between the luminance of the first subpixel SP1 through the supplying of the first data voltage Vdata and the luminance of the second subpixel SP2 through the supplying of the second data voltage Vdata.

Figure 12:
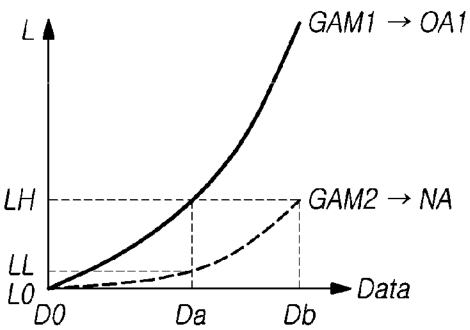
FIG. 12 illustrates example gamma curves differentially applied to the first optical area and the normal area in the display device according to aspects of the present disclosure.

FIG. 12 illustrates example gamma curves differentially applied to the first optical area OA1 and the normal area NA in the display device 100 according to aspects of the present disclosure.

Referring to FIG. 12, in the display device 100 according to aspects of the present disclosure, a driving-based technique can be provided in order to reduce a difference in luminance between the first optical area OA1 and the normal area NA due to an imbalance in the number of subpixels per unit area (e.g., resolution) between the first optical area OA1 and the normal area NA.

The second luminance difference compensation technique is the technique of applying different gamma curves (e.g., first and second gamma curves GAM1 and GAM2) when performing data driving for the first optical area OA1 and the normal area NA. That is, according to the second luminance difference compensation technique, a gamma curve used when data driving is performed for the second subpixel SP2 of the normal area NA may be the second gamma curve GAM2, and a gamma curve used when data driving is performed for the first subpixel SP1 of the first optical area OA1 may be the first gamma curve GAM1 different from the second gamma curve GAM2.

Gamma curves such as the first gamma curve GAM1 and the second gamma curve GAM2 can define or select changes in luminance according to changes in data. In the gamma curve, data that is a value on the X-axis may be digital image data Data supplied by the display controller 240 to the data driving circuit 220.

An amount of changed luminance with respect to an amount of changed data on the first gamma curve GAM1 may be greater than an amount of changed luminance with respect to an amount of changed data on the second gamma curve GAM2. For example, if the second gamma curve GAM2 is applied for the normal area NA, while data is changed from a reference data value D0 to a first data value Da, corresponding luminance may be changed from a reference luminance value L0 to a first luminance value LL. In another example, if the first gamma curve GAM1 is applied for the first optical area OA1, while data is changed from the reference data value D0 to the first data value Da, corresponding luminance may be changed from the reference luminance value L0 to a second luminance value LH.

Referring to FIG. 12, for example, the driving-based technique is based on a driving situation where both first data corresponding to the first subpixel SP1 of the first optical area OA1 and second data corresponding to the second subpixel SP2 of the normal area NA are equal in value (e.g., the first data value Da)

Here, the first data corresponding to the first subpixel SP1 may be digital image data supplied by the display controller 240 to the data driving circuit 220. The data driving circuit 220 can convert the first data into an analog first data voltage Vdata1, and output the converted first data voltage to the first data line DL1. The first data voltage Vdata1 output to the first data line DL1 can be supplied to the first subpixel SP1.

The second data corresponding to the second subpixel SP2 may be digital image data supplied by the display controller 240 to the data driving circuit 220. The data driving circuit 220 can convert the second data into an analog second data voltage Vdata2, and output the converted second data voltage to the second data line DL2. The second data voltage Vdata2 output to the second data line DL2 can be supplied to the second subpixel SP2.

Referring to FIG. 12, in the example of the above-described driving situation, according to the second luminance difference compensation technique according to embodiments of the present disclosure, even when the first data corresponding to the first subpixel SP1 of the first optical area OA1, and the second data corresponding to the second subpixel SP2 of the normal area NA are equal in value (e.g., the first data value Da), the second luminance value LH of the luminance of the first subpixel SP1 of the first optical area OA1 in which data driving is performed using the first gamma curve GAM1 may be greater than the first luminance value LL of the luminance of the second subpixel SP2 of the normal area NA in which the data driving is performed using the second gamma curve GAM2.

The data driving circuit 220 can convert the first data having the first data value Da into the first data voltage Vdata1 using the first gamma curve GAM1, and output the first data voltage Vdata1 to the first data line DL1 connected to the first subpixel SP1 of the first optical area OA1. The data driving circuit 220 can convert the second data having the first data value Da into the second data voltage Vdata2 using the second gamma curve GAM2, and output the second data voltage Vdata2 to the second data line DL2 connected to the second subpixel SP2 of the normal NA.

Referring to FIG. 12, referring to the second gamma curve GMA2, in the normal area NA, in order for the luminance of the second subpixel SP2 to reach the second luminance value LH, the second data corresponding to the second subpixel SP2 is needed to have a second data value Db.

In contrast, referring to the first gamma curve GMA1, in the first optical area OA1, in order for the luminance of the first subpixel SP1 to reach the second luminance value LH, the first data corresponding to the first subpixel SP1 is allowed to have the first data value Da that is less than the second data value Db.

Figure 13A:
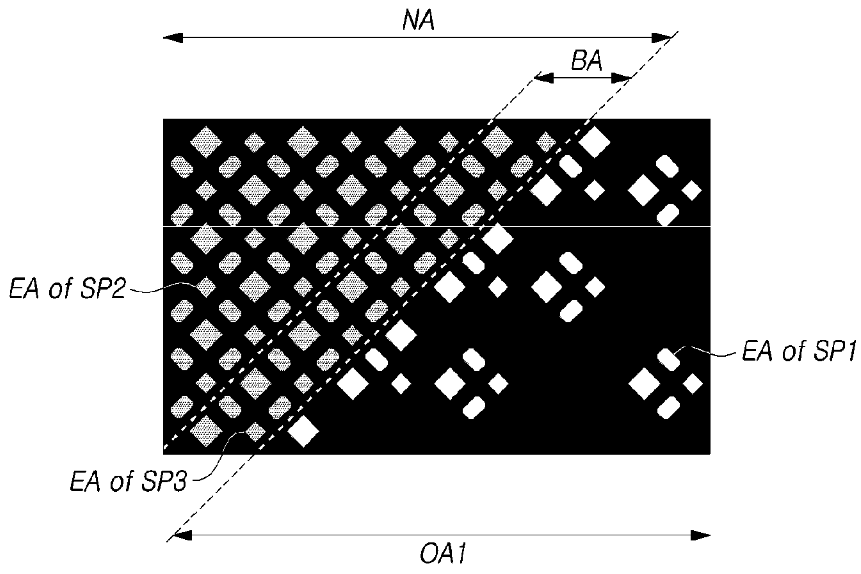
FIG. 13A illustrates a result of a lighting experiment on an example where a second gamma curve is applied to a boundary area outside of the first optical area in the display device according to aspects of the present disclosure.

FIG. 13A illustrates a result of a lighting experiment on an example where the second gamma curve GAM2 is applied for a boundary area BA outside of the first optical area OA1 in the display device 100 according to aspects of the present disclosure. FIG. 13B illustrates a result of a lighting experiment on an example where the first gamma curve GAM1 is applied for the boundary area BA outside of the first optical area OA1 in the display device 100 according to aspects of the present disclosure.

Figure 13B:
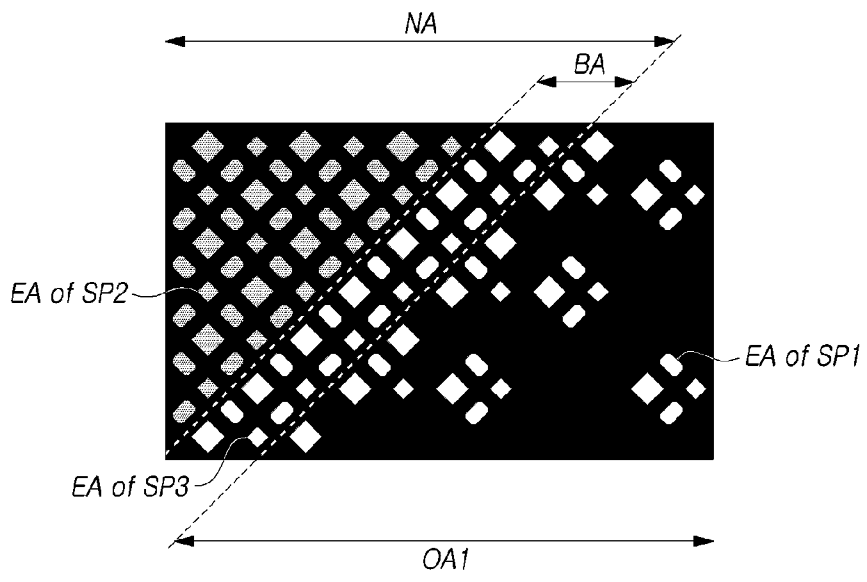
FIG. 13B illustrates a result of a lighting experiment on an example where a first gamma curve is applied to the boundary area outside of the first optical area in the display device according to aspects of the present disclosure.

FIGS. 13A and 13B, a plurality of first subpixels SP1 may be disposed in a non-transmission area of the first optical area OA1. A plurality of second subpixels SP2 may be disposed in the normal area NA, the whole of which serves as a non-transmission area.

FIGS. 13A and 13B, the normal area NA may include the boundary area BA located outside of the first optical area OA1. The boundary area BA may be an area surrounding the first optical area OA1. The boundary area BA may be an area included in the normal area NA, an area included in the first optical area OA1, or an area located between the normal area NA and the first optical area OA1.

For convenience of description, herein, the number of subpixels per unit area in the boundary area BA may correspond to the number of subpixels per unit area in the normal area NA, and based on this, the boundary area BA is defined as being (or considered to be) included in the normal area NA. It should be, however, understood that the scope of the present disclosure includes embodiments where the boundary area BA is an area included in the first optical area OA1, or an area located between the normal area NA and the first optical area OA1. Further, herein, although the boundary area BA is included in the normal area NA, a subpixel SP disposed in the boundary area BA is referred to as a third subpixel SP3.

Referring to FIG. 13A, if the second gamma curve GAM2 applied for data driving for second subpixels SP2 of the normal area NA is applied when data driving is performed for third subpixels SP3 disposed in the boundary area BA, the luminance of the third subpixels SP3 of the boundary area BA may be similar to the luminance of the second subpixels SP2 of the normal area NA.

As the above-described luminance difference compensation technique is used, a difference in luminance between the normal area NA and the first optical area OA1 may be reduced. However, since the above-described luminance difference compensation technique is an approach to increase the luminance of first subpixels SP1 of the first optical area OA1, when the luminance difference compensation technique is used, the luminance of first subpixels SP1 located in an outer edge of the first optical area OA1 may be greater than the luminance of third subpixels SP3 closest to the first optical area OA1 among third subpixels SP3 disposed in the boundary area BA. Accordingly, there may occur a phenomenon in which the first subpixels SP1 located in the outer edge of the first optical area OA1 are displayed or perceived brighter.

Referring to FIG. 13B, if the first gamma curve GAM1 applied for data driving for first subpixels SP1 of the first optical area OA1 is applied when data driving is performed for third subpixels SP3 disposed in the boundary area BA, there may occur a phenomenon in which the boundary area BA is displayed or perceived like a bright line.

The reason for the phenomenon where such a bright line is displayed or perceived is as follows. The number of subpixels per unit area in the boundary area BA may be greater than the number Noa1 of subpixels per unit area in the first optical area OA1. However, since the first gamma curve GAM1 for the first optical area OA1 is applied when data driving is performed for third subpixels SP3 of the boundary area BA, a level of the luminance of each third subpixel SP3 in the boundary area BA may become similar to a level of the luminance of first subpixels SP1 of the first optical area OA1. Accordingly, the boundary area BA may be displayed or perceived brighter like a bright line compared with the first optical area OA1 and the normal area NA.

Herein, a term encompassing the phenomenon in which an outer edge of the first optical area OA1 is displayed or perceived brighter (e.g., the example of FIG. 13A) and the phenomenon in which the boundary area BA located outside of the first optical area OA1 is displayed or perceived brighter (e.g., the example of FIG. 13B) may be referred to as a boundary display phenomenon, a boundary perception phenomenon or a boundary bright line phenomenon. The boundary display phenomenon, the boundary perception phenomenon or the boundary bright line phenomenon may act as a factor of degrading image quality. Hereinafter, a technique of eliminating or reducing the boundary display phenomenon, the boundary perception phenomenon or the boundary bright line phenomenon according to embodiments of the present disclosure will be described.

Figure 14:
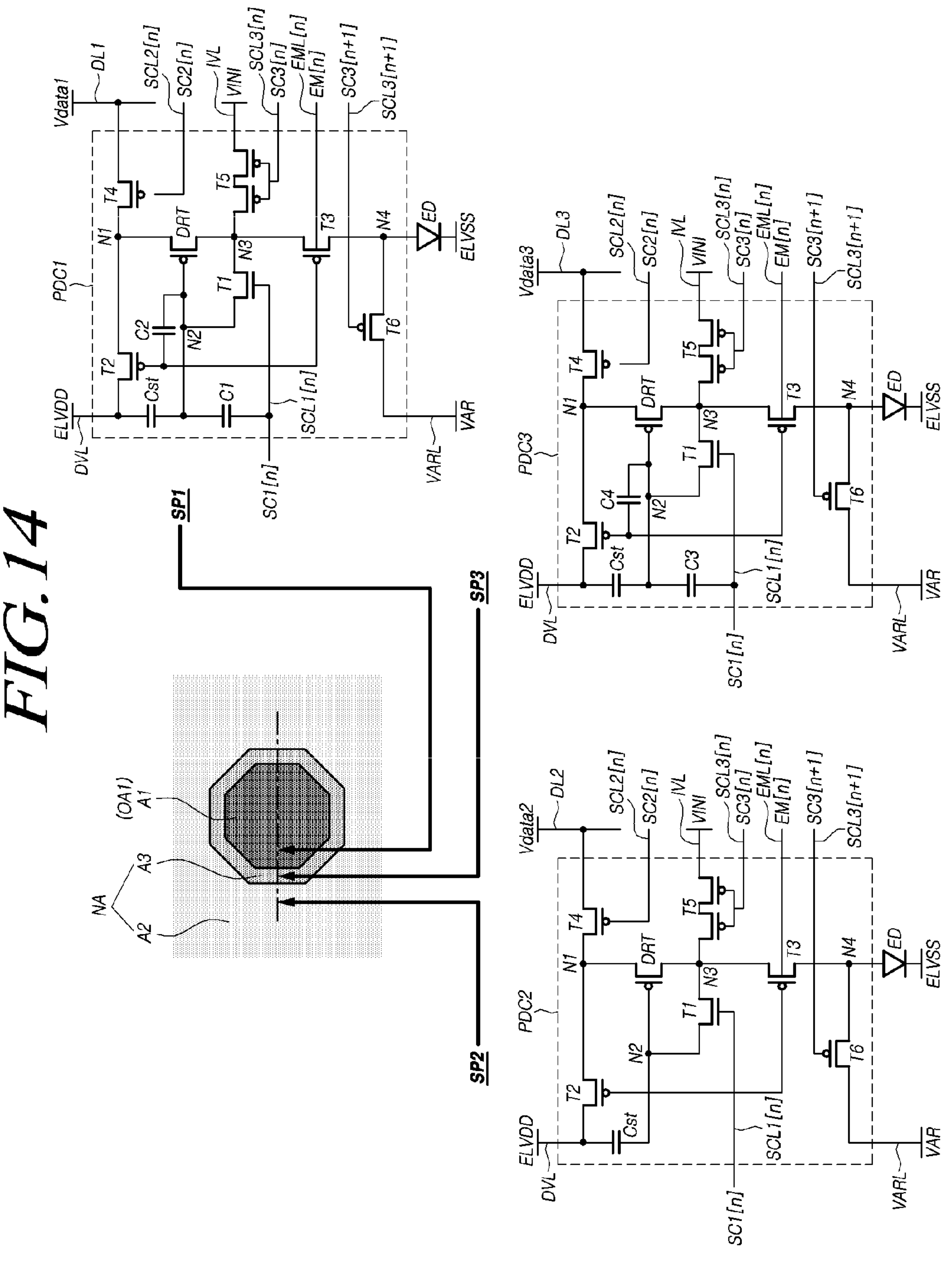
FIG. 14 illustrates an example equivalent circuit of a first subpixel disposed in a first area and an example equivalent circuit of a third subpixel disposed in a third area, in the display device according to aspects of the present disclosure.

FIG. 14 illustrates an example equivalent circuit of a first subpixel SP1 disposed in a first area A1 and an example equivalent circuit of a third subpixel SP3 in a third area A3 in the display device 100 according to aspects of the present disclosure.

Referring to FIG. 14, in some embodiments, a display area DA of the display device 100 may include a first area A1, a second area A2 surrounding, but spaced away from the first area A1, and a third area A3 located between the first area A1 and the second area A2.

Referring to FIG. 14, among a plurality of subpixels SP disposed in the display area DA, a first subpixel SP1 may be disposed in the first area A1, a second subpixel SP1 may be disposed in the second area A2, and a third subpixel SP3 may be disposed in the third area A3.

Referring to FIG. 14, the first area A1 may be included in the first optical area OA1, and the second area A2 may be included in the normal area NA. The third area A3 may be a boundary area outside of the first optical area OA1 and be included in the normal area NA.

The number of subpixels Noa1 per unit area in the first optical area OA1 may be less than the number Nna of subpixels per unit area in the normal area NA. For example, the number of subpixels Noa1 per unit area in the first area A1 may be less than the number Nna of subpixels per unit area in the second area A2.

In an example where the number Noa1 of subpixels per unit area in the first optical area OA1 is equal to the number Nna of subpixels per unit area in the normal area NA, a size of a subpixel in the first optical area OA1 may be smaller than a size of a subpixel in the normal area NA.

For example, a shape of the first optical area OA1 may be circular, semi-circular, elliptical, semi-elliptical, quadrangular, or octagonal. The shape of the first optical area OA1 is not limited thereto. For example, the first optical area OA1 may have various shapes.

Referring to FIG. 14, each of the first subpixel SP1, the second subpixel SP2, and the third subpixel SP3 may include a first node N1, a second node N2, a third node N3, and a fourth node N4, as main nodes.

The first subpixel SP1 may include a light emitting element ED connected to the fourth node N4 and a first pixel driving circuit PDC1 for driving the light emitting element ED. The first pixel driving circuit PDC1 can be controlled by a voltage at the second node N2 and may include a driving transistor DRT for driving the light emitting element ED.

The second subpixel SP2 may include a light emitting element ED connected to the fourth node N4 and a second pixel driving circuit PDC2 for driving the light emitting element ED. The second pixel driving circuit PDC2 can be controlled by a voltage at the second node N2 and may include a driving transistor DRT for driving the light emitting element ED.

The third subpixel SP3 may include a light emitting element ED connected to the fourth node N4 and a third pixel driving circuit PDC3 for driving the light emitting element ED. The third pixel driving circuit PDC3 can be controlled by a voltage at the second node N2 and may include a driving transistor DRT for driving the light emitting element ED.

Each of the first pixel driving circuit PDC1 of the first subpixel SP1, the second pixel driving circuit PDC2 of the second subpixel SP2, and the third pixel driving circuit PDC3 of the third subpixel SP3 may further include a first transistor T1 controlled by a first scan signal SC1[*n*] supplied through a first scan line SCL1[*n*], and configured to control a connection between the second node N2 and the third node N3.

Each of the first pixel driving circuit PDC1 of the first subpixel SP1, the second pixel driving circuit PDC2 of the second subpixel SP2, and the third pixel driving circuit PDC3 of the third subpixel SP3 may further include a second transistor T2 controlled by an emission control signal EM[n] supplied through an emission control line EML[n], and configured to control a connection between the first node N1 and a driving voltage line DVL.

Each of the first pixel driving circuit PDC1 of the first subpixel SP1, the second pixel driving circuit PDC2 of the second subpixel SP2, and the third pixel driving circuit PDC3 of the third subpixel SP3 may further include a third transistor T3 controlled by the emission control signal EM[n], and configured to control a connection between the third node N3 and the fourth node N4.

Referring to FIG. 14, the first subpixel SP1 disposed in the first area A1 may include, as a luminance difference compensation structure, at least one of a first compensation capacitor C1 between the second node N2 and the first scan line SCL1[*n*] and a second compensation capacitor C2 between the second node N2 and the emission control line EML[n].

Referring to FIG. 14, the third subpixel SP3 disposed in the third area A3 may include, as a boundary perception phenomenon improvement structure, at least one of a third compensation capacitor C3 between the second node N2 and the first scan line SCL1[*n*] and a fourth compensation capacitor C4 between the second node N2 and the emission control line EML[n].

Referring to FIG. 14, the second subpixel SP2 disposed in the second area A2 may not include the luminance difference compensation structure and the boundary perception phenomenon improvement structure. For example, the second subpixel SP2 disposed in the normal area NA may not include a compensation capacitor between the second node N2 and the first scan line SCL1[*n*] and a compensation capacitor between the second node N2 and the emission control line EML[n]. For example, in the second subpixel SP2 disposed in the normal area NA, the second node N2 and the first scan line SCL1[*n*] may not overlap each other, and the second node N2 and the emission control line EML[n] may not overlap each other.

Referring to FIG. 14, the first scan line SCL1[*n*] may not overlap a second connection pattern corresponding to the second node N2 in the second area A2, may overlap a third connection pattern corresponding to the second node N2 in the third area A3, and may overlap a first connection pattern corresponding to the second node N2 in the first area A1.

Referring to FIG. 14, the emission control line EML[n] may not overlap the second node N2 in the second area A2, may overlap the second node N2 in the third area A3, and may overlap the second node N2 in the first area A1.

The first scan line SCL1[*n*] may include one signal wiring metal or two or more signal wiring metals. The emission control line EML[n] may include one signal wiring metal or two or more signal wiring metals. In some embodiments, the second node N2 may be an electrical node, be one electrode pattern, be configured with two or more electrode patterns electrically connected with one another, or mean an equipotential point (place) rather than a physical electrode.

A capacitance of the first compensation capacitor C1 may be greater than or equal to a capacitance of the third compensation capacitor C3 (e.g., C1≥C3). A capacitance of the second compensation capacitor C2 may be greater than or equal to a capacitance of the fourth compensation capacitor C4 (e.g., C2≥C4). A combined capacitance (C1+C2) of the first compensation capacitor C1 and the second compensation capacitor C2 may be greater than or equal to a combined capacitance (C3+C4) of the third compensation capacitor C3 and the fourth compensation capacitor C4 (e.g., C1+C2≥C3+C4).

As described above, each of the first pixel driving circuit PDC1 of the first subpixel SP1, the second pixel driving circuit PDC2 of the second subpixel SP2, and the third pixel driving circuit PDC3 of the third subpixel SP3 may further include a fourth transistor T4 configured to control a connection between the first node N1 and a first data lines DL1, a fifth transistor T5 configured to control a connection between the third node N3 or the second node N2 and a first initialization line IVL, a sixth transistor T6 configured to control a connection between the fourth node N4 and a second initialization line VARL, and a storage capacitor Cst between the second node N2 and the driving voltage line DVL.

For example, the first transistor T1 may be an n-type transistor. Accordingly, a first kickback for the second node N2 may occur.

For example, the second transistor T2 and the third transistor T3 may be p-type transistors. Accordingly, a second kickback for the second node N2 may occur.

Figure 15:
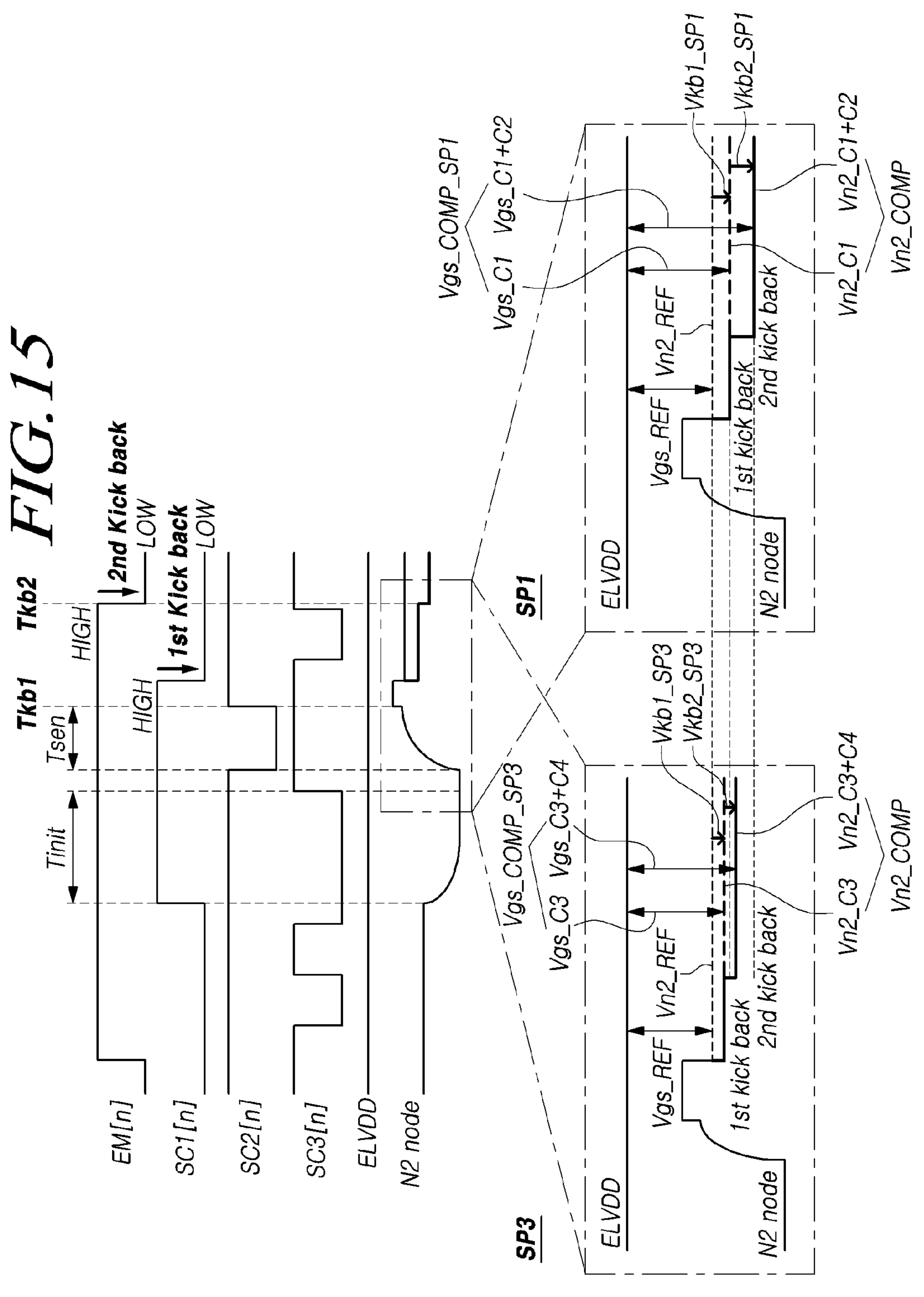
FIG. 15 illustrates an example driving timing diagram of the first subpixel disposed in the first area and an example driving timing diagram of the third subpixel disposed in the third area, in the display device according to aspects of the present disclosure.

FIG. 15 illustrates an example driving timing diagram of a first subpixel disposed in a first area (e.g., the first subpixel SP1 disposed in the first area A1 in FIG. 14) and an example driving timing diagram of a third subpixel in a third area (e.g., the third subpixel SP3 in the third area A3 in FIG. 14) in the display device 100 according to aspects of the present disclosure. The driving timing diagram of FIG. 15 may be, for example, based on the circuit of FIG. 14.

The driving timing diagram shown in FIG. 15 is basically the same as the driving timing diagram of FIG. 11, except that a voltage variance graph for the second node N2 in the third subpixel SP3 is further included. Considering such similarity, discussions on the same part as the driving timing diagram of FIG. 11 will not be repeatedly provided.

Referring to FIG. 15, when a first scan signal SC1[*n*] is changed from a high level voltage HIGH, which is a turn-on level voltage, to a low level voltage LOW, which is a turn-off level voltage at a first timing Tkb1, according to the voltage change of the first scan signal SC1[*n*] at the first timing Tkb1, a voltage at the second node N2 in the first subpixel SP1 may vary at the first timing Tkb1, and a voltage at the second node N2 in the third subpixel SP3 may vary at the first timing Tkb1.

At the first timing Tkb1, a voltage variance width (e.g., Vkb1_SP1=Vn2_REF−Vn2_C1) of the second node N2 in the first subpixel SP1 may be greater than or equal to a voltage variance width (e.g., Vkb1_SP3=Vn2_REF−Vn2_C3) of the second node N2 in the third subpixel SP3. As described above with reference to FIG. 11, it should be understood that "voltage variance width" may refer to magnitude of a voltage drop or voltage increase from a first voltage to a second voltage.

More specifically, when the first scan signal SC1[*n*] is changed from the turn-on level voltage (i.e., the high level voltage) to the turn-off level voltage (i.e., low level voltage) at the first timing Tkb1, according to the voltage change of the first scan signal SC1[*n*] at the first timing Tkb1, a voltage at the second node N2 in the first subpixel SP1 may be changed from a reference gate voltage Vn2_REF to a first kickback gate voltage Vn2_C1 resulting from a first kickback caused by the first compensation capacitor C1, and a voltage at the second node N2 in the third subpixel SP3 may be changed from the reference gate voltage Vn2_REF to a first kickback gate voltage Vn2_C3 resulting from a first kickback caused by the third compensation capacitor C3.

At the first timing Tkb1, a voltage variance width Vkb1_SP1 of the second node N2 in the first subpixel SP1 may be a difference (e.g., Vn2_REF−Vn2_C1) between the reference gate voltage Vn2_REF and the first kickback gate voltage Vn2_C1 resulting from the first kickback.

At the first timing Tkb1, a voltage variance width Vkb1_SP3 of the second node N2 in the third subpixel SP3 may be a difference (e.g., Vn2_REF−Vn2_C3) between the reference gate voltage Vn2_REF and the first kickback gate voltage Vn2_C3 resulting from the first kickback.

At the first timing Tkb1, a gate-source potential difference Vgs_COMP_SP1, which is a voltage difference between a gate voltage and a source voltage of a driving transistor DRT in the first subpixel SP1, may be a voltage difference (ELVDD−Vn2_C1) between the first kickback gate voltage Vn2_C1, which is the gate voltage of the driving transistor DRT (e.g., the voltage at the second node N2), and a driving voltage ELVDD, which is the source voltage of the driving transistor DRT (e.g., the voltage at the first node N1).

At the first timing Tkb1, a gate-source potential difference Vgs_COMP_SP3, which is a voltage difference between a gate voltage and a source voltage of a driving transistor DRT in the third subpixel SP3, may be a voltage difference (ELVDD−Vn2_C3) between the first kickback gate voltage Vn2_C3, which is the gate voltage of the driving transistor DRT (e.g., the voltage at the second node N2), and the driving voltage ELVDD, which is the source voltage of the driving transistor DRT (e.g., the voltage at the first node N1).

At the first timing Tkb1, the gate-source potential difference Vgs_COMP_SP1 of the driving transistor DRT in the first subpixel SP1 and the gate-source potential difference Vgs_COMP_SP3 of the driving transistor DRT in the third subpixel SP3 may be greater than a reference gate-source potential difference Vgs_REF.

At the first timing Tkb1, the gate-source potential difference Vgs_COMP_SP1 of the driving transistor DRT in the first subpixel SP1 may be greater than or equal to the gate-source potential difference Vgs_COMP_SP3 of the driving transistor DRT in the third subpixel SP3.

Referring to FIG. 15, at the first timing Tkb1, the first scan signal SC1[*n*] may be changed from the high level voltage HIGH, which is the turn-on level voltage, to the low level voltage LOW, which is the turn-off level voltage, and at a second timing Tkb2 proceeding after the first timing Tkb1, an emission control signal EM[n] may be changed from a high level voltage HIGH, which is a turn-off level voltage, to a low level voltage LOW, which is a turn-on level voltage.

Referring to FIG. 15, according to changes in voltage of the emission control signal EM[n] at the second timing Tkb2, a voltage at the second node N2 in the first subpixel SP1 may vary at the second timing Tkb2, and a voltage at the second node N2 in the third subpixel SP3 may vary at the second timing Tkb2.

Referring to FIG. 15, at the second timing Tkb2, a voltage variance width (e.g., Vkb2_SP1=Vn2_C1−Vn2_C1+C2) of the second node N2 in the first subpixel SP1 may be greater than or equal to a voltage variance width (e.g., Vkb2_SP3=Vn2_C3−Vn2_C3+C4) of the second node N2 in the third subpixel SP3.

More specifically, according to changes in voltage of the emission control signal EM[n] at the second timing Tkb2, the voltage of the second node N2 in the first subpixel SP1 may be changed again from the first kickback gate voltage Vn2_C1 resulting from the first kickback caused by the first compensation capacitor C1 to a second kickback gate voltage Vn2_C1+C2 resulting from a second kickback caused by the second compensation capacitor C2, and the voltage of the second node N2 in the third subpixel SP3 may be changed again from the first kickback gate voltage Vn2_C3 resulting from the first kickback caused by the third compensation capacitor C3 to a second kickback gate voltage Vn2_C4+C4 resulting from a second kickback caused by the fourth compensation capacitor C4.

At the second timing Tkb2, a voltage variance width Vkb2_SP1 of the second node N2 in the first subpixel SP1 may be a difference (e.g., Vn2_C1−Vn2_C1+C2) between the first kickback gate voltage Vn2_C1 resulting from the first kickback and the second kickback gate voltage Vn2_C1+C2 resulting from the second kickback.

At the second timing Tkb2, a voltage variance width Vkb2_SP3 of the second node N2 in the third subpixel SP3 may be a difference (e.g., Vn2_C3−Vn2_C3+C4) between the first kickback gate voltage Vn2_C3 resulting from the first kickback and the second kickback gate voltage Vn2_C3+C4 resulting from the second kickback.

At the second timing Tkb2, a gate-source potential difference Vgs_COMP_SP1, which is a voltage difference between a gate voltage and a source voltage of the driving transistor DRT in the first subpixel SP1, may be a voltage difference (e.g., ELVDD−Vn2_C1+C2) between the second kickback gate voltage Vn2_C1+C2, which is the gate voltage of the driving transistor DRT (e.g., the voltage at the second node N2), and the driving voltage ELVDD, which is the source voltage of the driving transistor DRT (e.g., the voltage at the first node N1).

At the second timing Tkb2, a gate-source potential difference Vgs_COMP_SP3, which is a voltage difference between a gate voltage and a source voltage of the driving transistor DRT in the third subpixel SP3, may be a voltage difference (e.g., ELVDD−Vn2_C3+C4) between the second kickback gate voltage Vn2_C3+C4, which is the gate voltage of the driving transistor DRT (e.g., the voltage at the second node N2), and the driving voltage ELVDD, which is the source voltage of the driving transistor DRT (i.e., the voltage at the first node N1).

At the second timing Tkb2, the gate-source potential difference Vgs_COMP_SP1 of the driving transistor DRT in the first subpixel SP1 and the gate-source potential difference Vgs_COMP_SP3 of the driving transistor DRT in the third subpixel SP3 may be greater than the reference gate-source potential difference Vgs_REF.

At the second timing Tkb2, the gate-source potential difference Vgs_COMP_SP1 of the driving transistor DRT in the first subpixel SP1 may be greater than or equal to the gate-source potential difference Vgs_COMP_SP3 of the driving transistor DRT in the third subpixel SP3.

Referring to FIG. 15, a voltage difference between a gate voltage and a source voltage of the driving transistor DRT in the first subpixel SP1 during an emission period of the first subpixel SP1 may be a first gate-source potential difference Vgs_COMP_SP1 (e.g., Vgs_C1+C2).

A voltage difference between a gate voltage and a source voltage of a driving transistor DRT in the second subpixel SP2 during the emission period of the second subpixel SP2 may be a second gate-source potential difference Vgs_REF.

A voltage difference between a gate voltage and a source voltage of the driving transistor DRT in the third subpixel SP3 during the emission period of the third subpixel SP3 may be a third gate-source potential difference Vgs_COMP_SP3 (e.g., Vgs_C3+C4).

Referring to FIG. 15, in an example where a first data voltage Vdata1 supplied to the first subpixel SP1, a second data voltage Vdata2 supplied to the second subpixel SP2, and a third data voltage Vdata3 supplied to a third subpixel SP3 are equal in magnitude, the first gate-source potential difference Vgs_COMP_SP1 of the driving transistor DRT of the first subpixel SP1 may be greater than the second gate-source potential difference Vgs_REF of the driving transistor DRT of the second subpixel SP2, and be greater than or equal to the third gate-source potential difference Vgs_COMP_SP3 of the driving transistor DRT of the third subpixel SP3.

As a voltage difference between a gate voltage and a source voltage of a driving transistor DRT increases, a driving current supplied by the driving transistor DRT to a light emitting element ED may increase, and thereby, the light emitting element ED can emit light brighter. For example, as the voltage difference between the gate voltage and the source voltage of the driving transistor DRT increases, the luminance of a corresponding subpixel SP can increase.

Referring to FIG. 15, in an example where the first data voltage Vdata1 supplied to the first subpixel SP1, the second data voltage Vdata2 supplied to the second subpixel SP2, and the third data voltage Vdata3 supplied to the third subpixel SP3 are equal in magnitude, the luminance of the first subpixel SP1 may be greater than that of the second subpixel SP2, and be greater than or equal to that of the third subpixel SP3.

The subpixels SP1, SP2, and SP3 illustrated in FIGS. 10 and 14 may include seven transistors (DRT, and T1 to T6). In one example, active layers (or source/drain/gate electrodes) of the seven transistors (DRT, and T1 to T6) may be formed in the same layer. In another example, one or more respective active layers (or source/drain/gate electrodes) of one or more of the seven transistors (DRT, and T1 to T6) may be formed in a different layer from active layers (or source/drain/gate electrodes) of the remaining transistors.

For example, in an example where all of the active layers (or source/drain/gate electrodes) of the seven transistors (DRT, and T1 to T6) are disposed in the same layer, the active layers of the seven transistors (DRT, and T1 to T6) may include a low temperature polysilicon (LTPS) semiconductor or an oxide semiconductor.

In another example, the one or more respective active layers of one or more of the seven transistors (DRT, and T1 to T6) may be disposed in a first layer, and the active layers of the remaining transistors may be disposed in a second layer higher than, or different from, the first layer. For example, the one or more active layers disposed in the first layer may include a low temperature polysilicon (LTPS) semiconductor, and the active layers disposed in the second layer may include an oxide semiconductor. In another example, the one or more active layers disposed in the first layer may include an oxide semiconductor, and the active layers disposed in the second layer may include a low temperature polysilicon (LTPS) semiconductor.

Figure 16A:
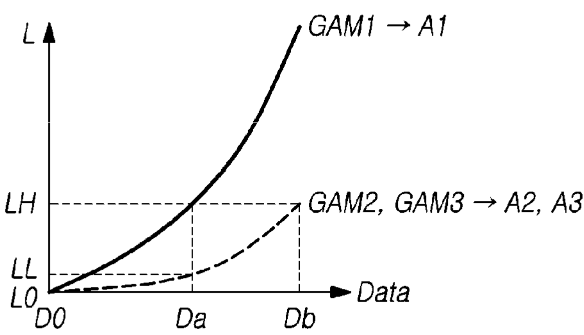
FIGS. 16A to 16C illustrate example first to third gamma curves differentially applied to first to third areas in the display device according to aspects of the present disclosure.
Figure 16B:
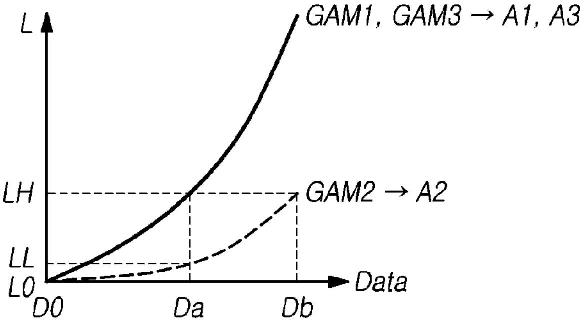
Figure 16C:
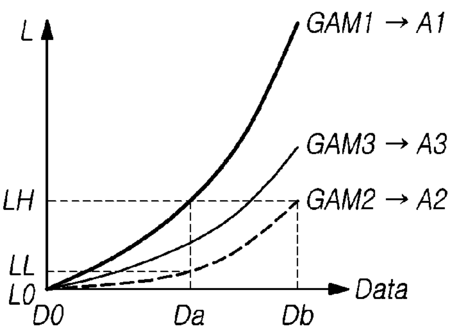

FIGS. 16A to 16C illustrate example first to third gamma curves (GAM1, GAM2, and GAM3) differentially applied for first to third areas (e.g., the first to third areas A1, A2, and A3 in FIGS. 14 and 15) in the display device 100 according to aspects of the present disclosure.

Referring to FIGS. 16A to 16C, the first gamma curve GAM1 corresponding to the first area A1 may be different from the second gamma curve GAM2 corresponding to the second area A2.

Referring to FIGS. 16A to 16C, in an example where first data corresponding to the first subpixel SP1 and second data corresponding to the second subpixel SP2 are equal in value, the luminance of the second subpixel SP2 in accordance with the second gamma curve GAM2 may have a second luminance value, and the luminance of the first subpixel SP1 in accordance with the first gamma curve GAM1 may have a first luminance value greater than the second luminance value.

Accordingly, even when the first optical area OA1 including the first area A1 has a relatively small number of subpixels per unit area, each first subpixel SP1 included the first optical areas OA1 including the first area A1 can emit light brighter, and thereby, have a luminance level similar to a luminance level of the normal area NA1 including the second area A2.

Referring to FIG. 16A, the third gamma curve GAM3 corresponding to the third area A3 and the second gamma curve GAM2 may be the same gamma curve. In this example, at least one of the third compensation capacitor C3 and the fourth compensation capacitor C4 may be formed in each of k number of third subpixels SP3 among m number of third subpixels SP3 disposed in the third area A3. Here, m may be a natural number greater than or equal to 2, and k may be less than or equal to m.

Referring to FIG. 16B, the third gamma curve GAM3 corresponding to the third area A3 and the first gamma curve GAM1 may be the same gamma curve. In this example, at least one of the third compensation capacitor C3 and the fourth compensation capacitor C4 may be formed in each of p number of third subpixels SP3 among m number of third subpixels SP3 disposed in the third area A3. Here, m is a natural number greater than or equal to 2, and p may be less than or equal to k, or less than k.

Referring to FIG. 16C, the third gamma curve GAM3 corresponding to the third area A3 may be different from the first and second gamma curves GAM1 and GAM2. In this example, at least one of the third compensation capacitor C3 and the fourth compensation capacitor C4 may be formed in each of q number of third subpixels SP3 among m number of third subpixels SP3 disposed in the third area A3. Here, m is a natural number greater than or equal to 2, and q may be less than or equal to k, or less than k.

According to the embodiments described above, in an example of improving the boundary perception phenomenon in the third area A3, which is the boundary area BA, as well as compensating for a difference in luminance between the first optical area OA1 and the normal area NA, the different compensation capacitor application technique according to the first luminance difference compensation technique may be further applied to the third subpixel SP3 of the third area A3, and the different gamma curve application technique according to the second luminance difference compensation technique may be further applied to the third subpixel SP3 of the third area A3.

Hereinafter, a structure in a plan view of a first pixel driving circuit PDC1 of a first subpixel SP1 to which the compensation capacitor structure is applied in a non-transmission area NTA in the first area A1, which is the first optical area OA1, will be described with reference to FIGS. 17A and 17B. A structure in a plan view of a second pixel driving circuit PDC2 of a second subpixel SP2 to which the compensation capacitor structure is not applied in the second area A2 included in the normal area NA will be described with reference to FIGS. 18A and 18B. A structure in a plan view of a third pixel driving circuit PDC3 of a third subpixel SP3 to which the compensation capacitor structure is applied in the third area A3, which is the boundary area BA, will be described with reference to FIGS. 19A and 19B.

Figure 17A:
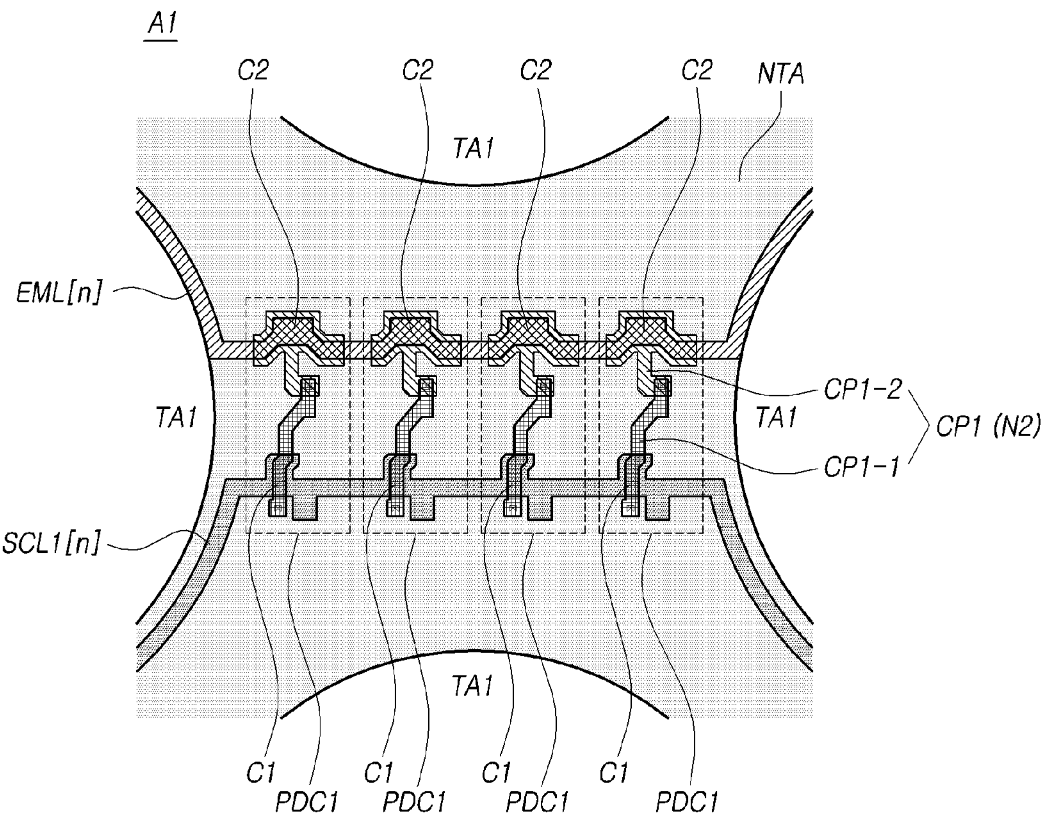
FIG. 17A is a plan view of a first area in the display device according to aspects of the present disclosure.
Figure 17B:
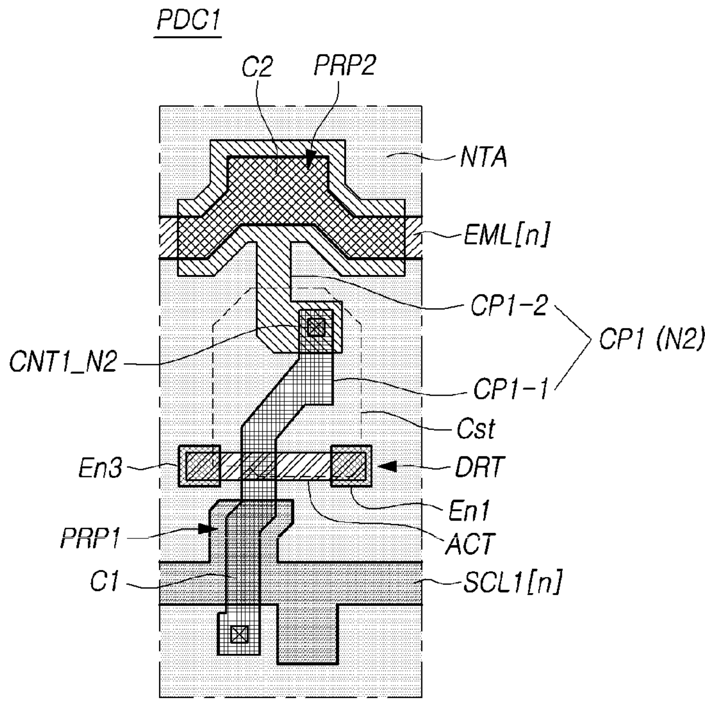
FIG. 17B is a plan view of an area where one first pixel driving circuit is disposed in the first area of FIG. 17A.
Figure 18A:
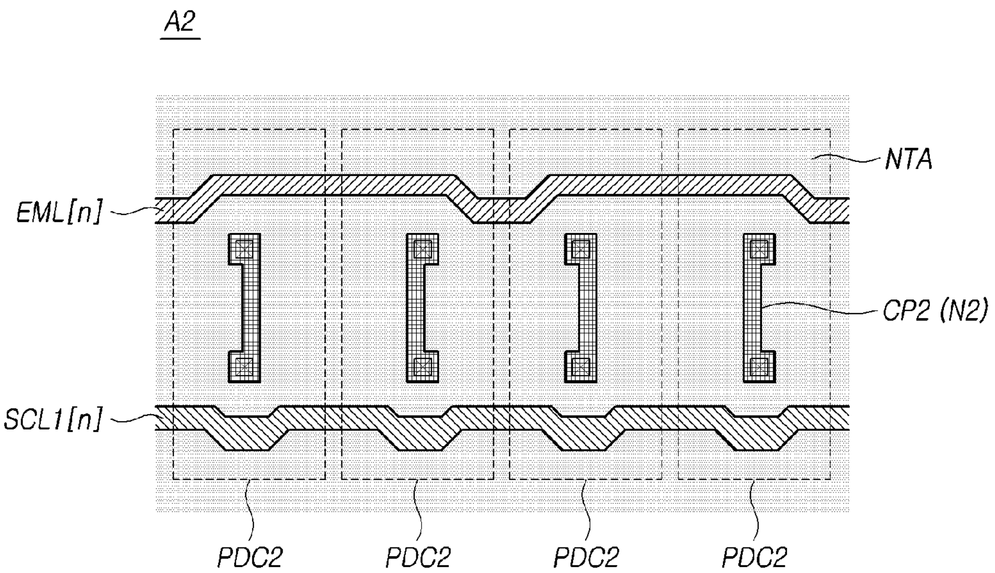
FIG. 18A is a plan view of a second area in the display device according to aspects of the present disclosure.
Figure 18B:
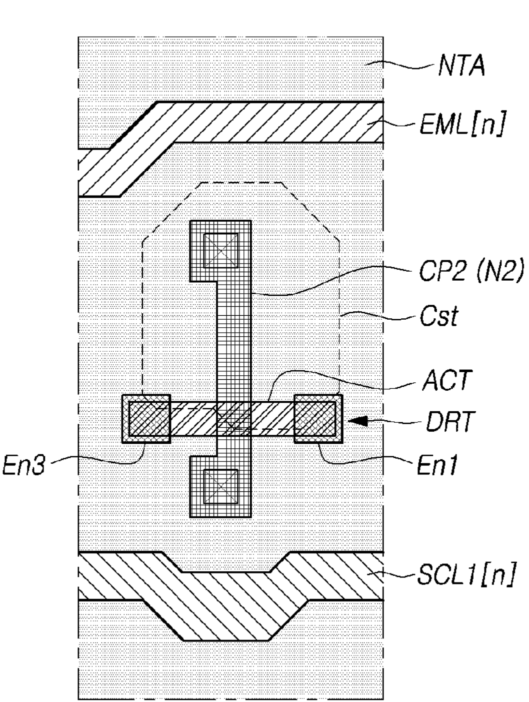
FIG. 18B is a plan view of an area where one second pixel driving circuit is disposed in the second area of FIG. 18A.
Figure 19A:
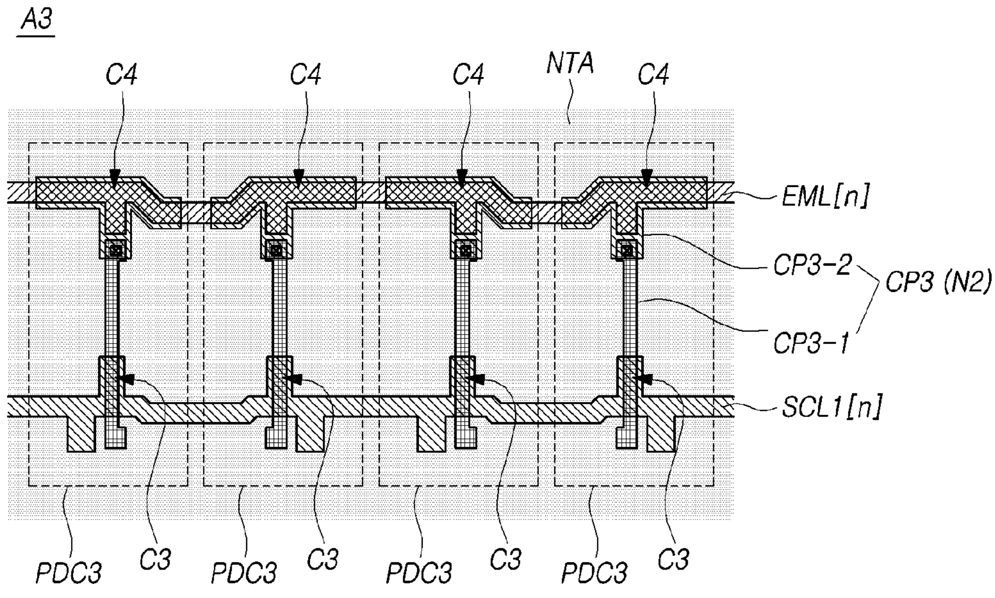
FIG. 19A is a plan view of a third area in the display device according to aspects of the present disclosure.
Figure 19B:
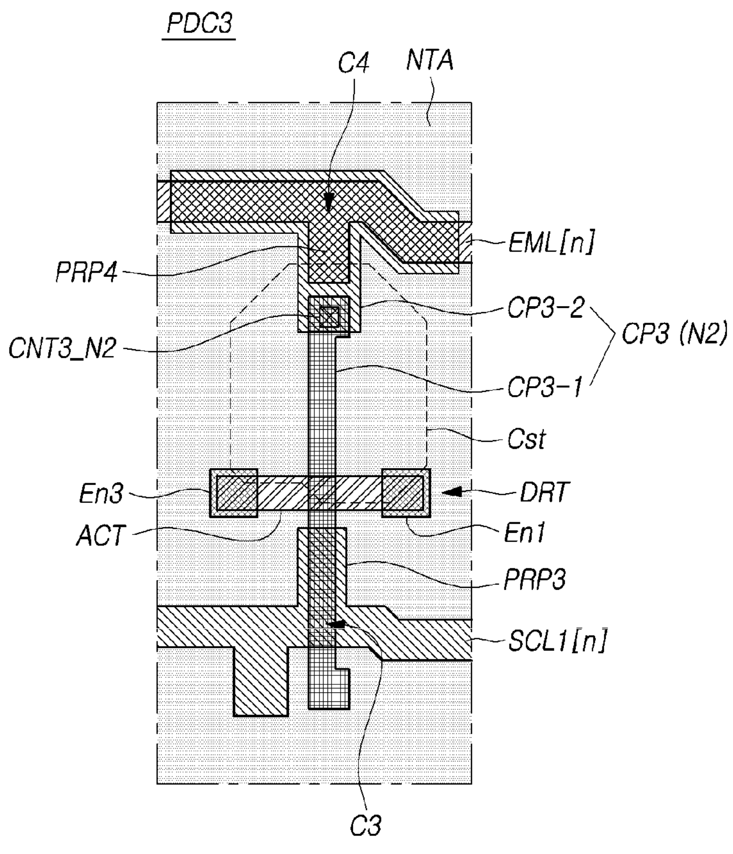
FIG. 19B is a plan view of an area where one third pixel driving circuit is disposed in the third area of FIG. 19A.

FIG. 17A is a plan view of a first area (e.g., the first area A1 in the figures discussed above) in the display device 100 according to aspects of the present disclosure, and FIG. 17B is a plan view of an area where one first pixel driving circuit PDC1 is disposed in the first area A1 of FIG. 17A. FIG. 18A is a plan view of a second area (e.g., the second area A2 in the figures discussed above) in the display device 100 according to aspects of the present disclosure, and FIG. 18B is a plan view of an area where one second pixel driving circuit PDC2 is disposed in the second area A2 of FIG. 18A. FIG. 19A is a plan view of a third area (e.g., the third area A3 in the figures discussed above) in the display device 100 according to aspects of the present disclosure, and FIG. 19B is a plan view of an area where one third pixel driving circuit PDC3 is disposed in the third area A3 of FIG. 19A.

Referring to FIGS. 17A and 17B, a first pixel driving circuit PDC1 of each first subpixel SP1 disposed in a non-transmission area NTA in the first area A1, which is the first optical area OA1, may include a first connection pattern CP1 corresponding to a second node N2, a first compensation capacitor C1 formed between the first connection pattern CP1 and a first scan line SCL1[*n*], and a second compensation capacitor C2 formed between the first connection pattern CP1 and an emission control line EML[n].

A driving transistor DRT and a storage capacitor Cst may be disposed in an area of each of first pixel driving circuits PDC1 of a plurality of first subpixels SP1 disposed in the non-transmission area NTA in the first area A1, which is the first optical area OA1.

Each driving transistor DRT may include a source electrode En1 corresponding to a first node N1, a drain electrode En3 corresponding to a third node N3, a connection pattern CP corresponding to the second node N2 and serving as a gate electrode, and an active layer ACT. The storage capacitor Cst may be formed between the second node N2 and a driving voltage line DVL.

The first compensation capacitor C1 can be formed as the first connection pattern CP1 and the first scan line SCL1[*n*] overlap each other. A capacitance of the first compensation capacitor C1 may be proportional to an overlapping area of the first connection pattern CP1 and the first scan line SCL1[*n*].

In order to increase a capacitance of the first compensation capacitor C1, the first scan line SCL1[*n*] may include a first compensation protrusion PRP1 overlapping the first connection pattern CP1 in an area of the first subpixel SP1.

The second compensation capacitor C2 can be formed as the first connection pattern CP1 and the emission control line EML[n] overlap each other. A capacitance of the second compensation capacitor C2 may be proportional to an overlapping area of the first connection pattern CP1 and the emission control line EML[n].

In order to increase a capacitance of the second compensation capacitor C2, the emission control line EML[n] may include a second compensation protrusion PRP2 overlapping the first connection pattern CP1 in an area of the first subpixel SP1.

The first connection pattern CP1 may overlap an active layer ACT of a driving transistor DRT in the first subpixel SP1 in the area of the first subpixel SP1.

The first connection pattern CP1 may include a first partial connection pattern CP1-1 overlapping the first compensation protrusion PRP1 and a second partial connection pattern CP1-2 overlapping the second compensation protrusion PRP2.

The first partial connection pattern CP1-1 and the second partial connection pattern CP1-2 may be located in different layers and may be electrically connected to each other through a first contact hole CNT1_N2.

Referring to FIGS. 18A and 18B, a second pixel driving circuit PDC2 of each of second subpixels SP2 disposed in the second area A2 included in the normal area NA may include a second connection pattern CP2 corresponding to a second node N2.

A driving transistor DRT and a storage capacitor Cst may be disposed in an area of each of second pixel driving circuits PDC2 of a plurality of second subpixels SP2 disposed in the second area A2 included in the normal region NA. The second area A2 may be a non-transmission area NTA.

Each driving transistor DRT may include a source electrode En1 corresponding to a first node N1, a drain electrode En3 corresponding to a third node N3, a connection pattern CP corresponding to the second node N2 and serving as a gate electrode, and an active layer ACT. The storage capacitor Cst may be formed between the second node N2 and a driving voltage line DVL.

The second connection pattern CP2 and the first scan line SCL1[*n*] may not overlap each other. Accordingly, a compensation capacitor between the second connection pattern CP2 and the first scan line SCL1[*n*] may not be formed in the second subpixel SP2.

The second connection pattern CP2 and the emission control line EML[n] may not overlap each other. Accordingly, a compensation capacitor between the second connection pattern CP2 and the emission control line EML[n] may not be formed in the second subpixel SP2.

Referring to FIGS. 19A and 19B, a third pixel driving circuit PDC3 of each third subpixel SP3 to which the compensation capacitor structure is applied in the third area A3, which is the boundary area BA, may include a third connection pattern CP3 corresponding to a second node N2, a third compensation capacitor C3 formed between the third connection pattern CP3 and the first scan line SCL1[*n*], and a fourth compensation capacitor C4 formed between the third connection pattern CP3 and the emission control line EML[n].

A driving transistor DRT and a storage capacitor Cst may be disposed in an area of each of third pixel driving circuits PDC3 of a plurality of third subpixels SP3 disposed in the third area A3, which is the boundary area BA outside of the first optical area OA1. The third area A3 may be a non-transmission area NTA.

Each driving transistor DRT may include a source electrode En1 corresponding to a first node N1, a drain electrode En3 corresponding to a third node N3, a connection pattern CP corresponding to the second node N2 and serving as a gate electrode, and an active layer ACT. The storage capacitor Cst may be formed between the second node N2 and a driving voltage line DVL.

The third compensation capacitor C3 can be formed as the third connection pattern CP3 and the first scan line SCL1[*n*] overlap each other. A capacitance of the third compensation capacitor C3 may be proportional to an overlapping area of the third connection pattern CP3 and the first scan line SCL1[*n*].

In order to increase a capacitance of the third compensation capacitor C3, the first scan line SCL1[*n*] may include a third compensation protrusion PRP3 overlapping the third connection pattern CP3 in an area of the third subpixel SP3.

The fourth compensation capacitor C4 can be formed as the third connection pattern CP3 and the emission control line EML[n] overlap each other. A capacitance of the fourth compensation capacitor C4 may be proportional to an overlapping area of the third connection pattern CP3 and the emission control line EML[n].

In order to increase a capacitance of the fourth compensation capacitor C4, the emission control line EML[n] may include a fourth compensation protrusion PRP4 overlapping the third connection pattern CP3 in an area of the third subpixel SP3.

The third connection pattern CP3 may overlap an active layer ACT of a driving transistor DRT in the third subpixel SP3.

The third connection pattern CP3 may include a third partial connection pattern CP3-1 overlapping the third compensation protrusion PRP3 and a fourth partial connection pattern CP3-2 overlapping the fourth compensation protrusion PRP4.

The third partial connection pattern CP3-1 and the fourth partial connection pattern CP3-2 may be located in different layers and may be electrically connected to each other through a third contact hole CNT3_N2.

A capacitance of the third compensation capacitor C3 may be less than or equal to a capacitance of the first compensation capacitor C1. An overlapping area between the third connection pattern CP3 and the first scan line SCL1[*n*] may be less than or equal to an overlapping area between the first connection pattern CP1 and the first scan line SCL1[*n*].

A capacitance of the fourth compensation capacitor C4 may be less than or equal to a capacitance of the second compensation capacitor C2. An overlapping area between the third connection pattern CP3 and the emission control line EML[n] may be less than or equal to an overlapping area between the first connection pattern CP1 and the emission control line EML[n].

Hereinafter, the display device 100 according to the embodiments described above will be briefly described again. In some embodiments, the touch display device 100 may include a substrate SUB including a display area DA for displaying an image, a plurality of gate lines GL disposed on the substrate SUB, and a plurality of subpixels SP disposed in the display area DA.

The display area DA may include a first area A1, a second area A2, and a third area A3. The second area A2 may surround the first area A1, and the third area A3 may be located between the first area A1 and the second area A2.

A first gate line GL among the plurality of gate lines GL may run through a second area A2, a third area A3, and a first area A1. The first gate line GL may be the first scan line SCL1[*n*] or the emission control line EML[n] of FIG. 14.

Among the plurality of subpixels SP, a first subpixel SP1, a second subpixel SP1, and a third subpixel SP3 may be disposed in the first area A1, the second area A2, and the third area A3, respectively. Each of the first subpixel SP1, the second subpixel SP2, and the third subpixel SP3 may include a light emitting element and a driving transistor.

The first gate line GL may not overlap a second connection pattern CP2 corresponding to the gate node of a driving transistor DRT in the second subpixel SP2, may overlap a third connection pattern CP3 corresponding to the gate node of a driving transistor DRT in the third subpixel SP3, and may overlap a first connection pattern CP1 corresponding to the gate node of a driving transistor DRT in the first subpixel SP1. The gate node of the driving transistor DRT may correspond to a second node N2.

As the first gate line GL overlaps the gate node of the driving transistor DRT in the first subpixel SP1, a compensation capacitor (C1 or C2) may be formed in the first subpixel SP1. That is, the first subpixel SP1 may include a first compensation capacitor (C1 or C2) between the gate node of the driving transistor DRT and the first gate line GL.

As the first gate line GL overlaps the gate node of the driving transistor DRT in the third subpixel SP3, a compensation capacitor (C3 or C4) may be formed in the third subpixel SP3. That is, the third subpixel SP3 may include a compensation capacitor (C3 or C4) between the gate node of the driving transistor DRT and the first gate line GL.

A capacitance of the compensation capacitor (C3 or C4) of the third subpixel SP3 may be different from a capacitance of the compensation capacitor (C1 or C2) of the first subpixel SP1.

In some embodiments, the display device 100 may include a display area DA for displaying an image and a plurality of subpixels SP disposed in the display area DA. The display area DA of the display device 100 may include a first area A1, a second area A2 surrounding or spaced away from the first area A1, and a third area A3 located between the first area A1 and the second area A2.

Among the plurality of subpixels SP, a first subpixel SP1, a second subpixel SP1, and a third subpixel SP3 may be disposed in the first area A1, the second area A2, and the third area A3, respectively.

In an example where first data corresponding to the first subpixel SP1 is equal to second data corresponding to the second subpixel SP2, the luminance of the first subpixel SP1 may be greater than the luminance of the second subpixel SP2.

As the luminance of the first subpixel SP1 increases, the luminance of the first area A1 in which the first subpixel SP1 is disposed may increase up to a level corresponding to the luminance of the second area A2. Accordingly, a difference in luminance between the first subpixel SP1 and the second subpixel SP2 may be greater than a difference in luminance between the first area A1 and the second area A2.

The third subpixel SP3 may have a luminance in the range of the luminance of the first subpixel SP1 to the luminance of the second subpixel SP2. Accordingly, the boundary perception phenomenon in which the first area A1 and the second area A2 are perceived to be unnaturally separated can be reduced or eliminated, and thereby, the first area A1, the third area A3, and the second area A2 can be perceived to be naturally connected.

In order to compensate for differences in luminance between areas and to reduce or eliminate the boundary perception phenomenon, in an example where third data corresponding to the third subpixel SP3 is equal to first data and second data, the luminance of the first subpixel SP1 may be greater than that of the second subpixel SP2, and may be greater than or equal to that of the third subpixel SP3.

To compensate for a difference in luminance between areas, the first subpixel SP1 may further include an additional capacitor compared to the second subpixel SP2. The additional capacitor included in the first subpixel SP1 may be at least one of the first compensation capacitor C1 and the second compensation capacitor C2 of FIG. 10 or FIG. 14.

To reduce or eliminate the boundary perception phenomenon, each of the first subpixel SP1 and the third subpixel SP3 may further include an additional capacitor compared to the second subpixel SP2. The additional capacitor included in the first subpixel SP1 and the additional capacitor included in the third subpixel SP3 may have different capacitances. By including the additional capacitor in the first subpixel SP1, the third subpixel SP3, or both, capacitance between the first scan line SCL1[*n*] and the second node N2 may be greater in the first and third subpixels SP1, SP3 (e.g., in the optical areas OA1, OA2 and the boundary area BA) than in the second subpixel SP2 (e.g., the normal area NA). For example, no additional capacitor may be present in the second subpixel SP2 between the first scan line SCL1[*n*] and the second node N2, or a parasitic capacitor may be present therebetween. In either case, the capacitance between the first scan line SCL1[*n*] and the second node N2 of the second subpixel SP2 is smaller than that between the first scan line SCL1[*n*] and the second nodes N2 of the first subpixel SP1, the third subpixel SP3, or both.

The additional capacitor included in the first subpixel SP1 may be at least one of the first compensation capacitor C1 and the second compensation capacitor C2 of FIG. 14. The additional capacitor included in the third subpixel SP3 may be at least one of the third compensation capacitor C3 and the fourth compensation capacitor C4 of FIG. 14.

To compensate for a difference in luminance between areas, different gamma curves GAM1 and GAM2 may be applied for the first area A1 and the second area A2. For example, a first gamma curve GAM1 for the first area A1 may be different from a second gamma curve GAM2 for the second area A2.

To reduce or eliminate the boundary perception phenomenon, a third gamma curve GAM3 for the third area A3 may be the same as the first or second gamma curve GAM1 or GAM2, or may be different from the first and second gamma curves GAM1 and GAM2.

Each of the first gamma curve GAM1, the second gamma curve GAM2, and the third gamma curve GAM3 can define or select changes in luminance according to changes in data. Respective data for the first gamma curve GAM1, the second gamma curve GAM2, and the third gamma curve GAM3 may be stored in a memory included in the display device 100.

In addition, the first gamma curve GAM1, the second gamma curve GAM2, and the third gamma curve GAM3 may be respectively applied to the first area A1, the second area A2, and the third area A3 based on a result obtained by measuring changes in luminance according to changes in data in the display device 100.

In the foregoing discussions, the technique of compensating for a difference in luminance between the first optical area OA1 and the normal area NA, and the technique of reducing or eliminating the boundary perception phenomenon between the first optical area OA1 and the normal area NA have been described.

Taking account of a difference in the number of subpixels per unit area between the first optical area OA1 and the second optical area OA2, the technique of compensating for a difference in luminance between the first optical area OA1 and the normal area NA may be substantially equally used as a technique of compensating for a difference in luminance between the second optical area OA2 and the normal area NA.

Taking account of a difference in the number of subpixels per unit area between the first optical area OA1 and the second optical area OA2, the technique of reducing or eliminating the boundary perception phenomenon between the first optical area OA1 and the normal area NA may be substantially equally used as a technique of reducing or eliminating the boundary perception phenomenon between the second optical area OA2 and the normal area NA.

According to the embodiments described herein, a display device (e.g., the display device 100 in the figures discussed above) can be provided that is capable of reducing or eliminating a difference in luminance between one or more optical areas (e.g., the optical areas OA1 and OA2 in the figures discussed above) and a normal area (e.g., the normal area NA in the figures discussed above).

According to the embodiments described herein, a display device (e.g., the display device 100 in the figures discussed above) can be provided that is capable of reducing or eliminating a difference in luminance between one or more optical areas (e.g., the optical areas OA1 and OA2 in the figures discussed above) and a normal area (e.g., the normal area NA in the figures discussed above) by applying a compensation capacitor structure to the one or more optical areas OA1 and OA2.

According to the embodiments described herein, a display device (e.g., the display device 100 in the figures discussed above) can be provided that is capable of reducing or eliminating a difference in luminance between one or more optical areas (e.g., the optical areas OA1 and OA2 in the figures discussed above) and a normal area (e.g., the normal area NA in the figures discussed above) by applying different gamma curves to the one or more optical areas OA1 and OA2 and the normal area NA.

According to the embodiments described herein, a display device (e.g., the display device 100 in the figures discussed above) can be provided that is capable of preventing the perception of a boundary between one or more optical areas (e.g., the optical areas OA1 and OA2 in the figures discussed above) and a normal area (e.g., the normal area NA in the figures discussed above).

The above description has been presented to enable any person skilled in the art to make, use and practice the technical features of the present disclosure, and has been provided in the context of a particular application and its benefits as examples. Various modifications, additions and substitutions to the described embodiments will be readily apparent to those skilled in the art, and the principles described herein may be applied to other embodiments and applications without departing from the scope of the present disclosure. The above description and the accompanying drawings provide examples of the technical features of the present disclosure for illustrative purposes only. That is, the disclosed embodiments are intended to illustrate the scope of the technical features of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:

a display area including:

a first area;

a second area laterally spaced from the first area; and a third area located between the first area and the second area; and a plurality of subpixels disposed in the display area, the plurality of subpixels including:

a first subpixel disposed in the first area;

a second subpixel disposed in the second area; and a third subpixel disposed in the third area;

wherein each of the first, second and third subpixels includes:

a first node, a second node, a third node, and a fourth node;

a light emitting element connected to the fourth node;

a driving transistor controlled by a voltage at the second node and configured to drive the light emitting element;

a first transistor controlled by a first scan signal supplied through a first scan line and configured to control a connection between the second node and the third node;

a second transistor controlled by an emission control signal supplied through an emission control line and configured to control a connection between the first node and a driving voltage line; and a third transistor controlled by the emission control signal and configured to control a connection between the third node and the fourth node;

wherein the first subpixel includes at least one of:

a first compensation capacitor between the second node and the first scan line; and a second compensation capacitor between the second node and the emission control line;

wherein the third subpixel includes at least one of:

a third compensation capacitor between the second node and the first scan line; and a fourth compensation capacitor between the second node and the emission control line.

2. The display device according to claim 1, wherein the first scan line does not overlap a connection pattern corresponding to the second node in the second area, overlaps a connection pattern corresponding to the second node in the third area, and overlaps a connection pattern corresponding to the second node in the first area, and wherein the emission control line does not overlap the connection pattern corresponding to the second node in the second area, overlaps the connection pattern corresponding to the second node in the third area, and overlaps the connection pattern corresponding to the second node in the first area.

3. The display device according to claim 1, wherein:

a capacitance of the first compensation capacitor is greater than or equal to a capacitance of the third compensation capacitor; or a capacitance of the second compensation capacitor is greater than or equal to a capacitance of the fourth compensation capacitor; or a combined capacitance of the first compensation capacitor and the second compensation capacitance is greater than or equal to a combined capacitance of the third compensation capacitor and the fourth compensation capacitance.

4. The display device according to claim 1, wherein when the first scan signal is changed from a turn-on level voltage to a turn-off level voltage at a first timing, according to the voltage change of the first scan signal at the first timing, a voltage at the second node in the first subpixel varies at the first timing, and a voltage at the second node in the third subpixel varies at the first timing, and wherein a voltage variance width of the second node in the first subpixel is greater than or equal to a voltage variance width of the second node in the third subpixel.

5. The display device according to claim 1, wherein when the first scan signal is changed from a turn-on level voltage to a turn-off level voltage at a first timing, and the emission control signal is changed from a turn-off level voltage to a turn-on level voltage at a second timing proceeding after the first timing, according to the voltage change of the emission control signal at the second timing, a voltage at the second node in the first subpixel varies at the second timing, and a voltage at the second node in the third subpixel varies at the second timing, and wherein a voltage variance width of the second node in the first subpixel is greater than or equal to a voltage variance width of the second node in the third subpixel.

6. The display device according to claim 1, wherein a voltage difference between a gate voltage and a source voltage of the driving transistor in the first subpixel during an emission period of the first subpixel is a first gate-source potential difference, and a voltage difference between a gate voltage and a source voltage of the driving transistor in the second subpixel during an emission period of the second subpixel is a second gate-source potential difference, and a voltage difference between a gate voltage and a source voltage of the driving transistor in the third subpixel during an emission period of the third subpixel is a third gate-source potential difference, and wherein when a first data voltage supplied to the first subpixel, a second data voltage supplied to the second subpixel, and a third data voltage supplied to the third subpixel are equal in magnitude, the first gate-source potential difference is greater than the second gate-source potential difference, and is greater than or equal to the third gate-source potential difference.

7. The display device according to claim 1, wherein when a first data voltage supplied to the first subpixel, a second data voltage supplied to the second subpixel, and a third data voltage supplied to the third subpixel are equal in magnitude, a luminance of the first subpixel is greater than a luminance of the second subpixel, and is greater than or equal to a luminance of the third subpixel.

8. The display device according to claim 1, wherein a first gamma curve corresponding to the first area is different from a second gamma curve corresponding to the second area, and wherein when first data corresponding to the first subpixel is equal to second data corresponding to the second subpixel, a luminance of the second subpixel according to the second gamma curve has a second luminance value, and a luminance of the first subpixel according to the first gamma curve has a first luminance value greater than the second luminance value.

9. The display device according to claim 8, wherein a third gamma curve corresponding to the third area and the second gamma curve are the same gamma curve.

10. The display device according to claim 8, wherein a third gamma curve corresponding to the third area and the first gamma curve are the same gamma curve.

11. The display device according to claim 8, wherein a third gamma curve corresponding to the third area is different from the first gamma curve and the second gamma curve.

12. The display device according to claim 1, wherein the first subpixel comprises a first connection pattern corresponding to the second node of the first subpixel, a first compensation capacitor between the first connection pattern and the first scan line, and a second compensation capacitor between the first connection pattern and the emission control line, wherein the second subpixel comprises a second connection pattern corresponding to the second node of the second subpixel, and wherein the third subpixel comprises a third connection pattern corresponding to the second node of the third subpixel, a third compensation capacitor between the third connection pattern and the first scan line, and a fourth compensation capacitor between the third connection pattern and the emission control line.

13. The display device according to claim 12, wherein the first scan line comprises a first compensation protrusion overlapping the first connection pattern in an area of the first subpixel, and the emission control line comprises a second compensation protrusion overlapping the first connection pattern in the area of the first subpixel, and wherein the first connection pattern overlaps an active layer of the driving transistor in the first subpixel in the area of the first subpixel.

14. The display device according to claim 13, wherein the first connection pattern comprises a first partial connection pattern overlapping the first compensation protrusion and a second partial connection pattern overlapping the second compensation protrusion, and wherein the first partial connection pattern and the second partial connection pattern are located in different layers and are electrically connected to each other through a first contact hole.

15. The display device according to claim 12, wherein the first scan line comprises a third compensation protrusion overlapping the third connection pattern in an area of the third subpixel, and the emission control line comprises a fourth compensation protrusion overlapping the third connection pattern in the area of the third subpixel, and wherein the third connection pattern overlaps an active layer of the driving transistor in the third subpixel.

16. The display device according to claim 15, wherein the third connection pattern comprises a third partial connection pattern overlapping the third compensation protrusion, and a fourth partial connection pattern overlapping the fourth compensation protrusion, and wherein the third partial connection pattern and the fourth partial connection pattern are located in different layers and are electrically connected to each other through a third contact hole.

17. The display device according to claim 1, wherein the display area comprises an optical area and a normal area located outside of the optical area, wherein the optical area comprises a plurality of light emitting areas and a plurality of transmission areas, and the normal area comprises a plurality of light emitting areas, wherein the first area is included in the optical area, the second area is included in the normal area, and the third area is a boundary area outside of the optical area and is included in the normal area, and wherein a number of subpixels per unit area in the optical area is less than a number of subpixels per unit area in the normal area, or a size of a subpixel in the optical area is smaller than a size of a subpixel in the normal area.

18. The display device according to claim 1, wherein the first transistor is an n-type transistor, and the second transistor and the third transistor are p-type transistors.

19. The display device according to claim 1, wherein each of the first, second and third subpixels comprises:

a fourth transistor configured to control a connection between the first node and a first data line;

a fifth transistor configured to control a connection between the third node and a first initialization line, or between the second node and the first initialization line;

a sixth transistor configured to control a connection between the fourth node and a second initialization line; and a storage capacitor disposed between the second node and the driving voltage line.

20. A display device comprising:

a substrate including a display area, the display area including:

a first area;

a second area spaced away from the first area; and a third area located between the first area and the second area;

a plurality of gate lines disposed over the substrate, the plurality of gate lines including a first gate line disposed in respective portions of the second area, the third area, and the first area; and a plurality of subpixels disposed in the display area, the plurality of subpixels including:

a first subpixel disposed in the first area;

a second subpixel disposed in the second area; and a third subpixel disposed in the third area;

wherein each of the first, second and third subpixels includes a light emitting element and a driving transistor, and wherein in a structure where the first gate line runs such that the first gate line extends from the second area, passes through the third area not allowing light to be transmitted, and reaches the first area including at least one transmission area located between two or more corresponding third subpixels among a plurality of third subpixels, the first gate line overlaps a first connection pattern corresponding to a gate node of the driving transistor in the first subpixel, does not overlap a second connection pattern corresponding to a gate node of the driving transistor in the second subpixel, and overlaps a third connection pattern corresponding to a gate node of the driving transistor in the third subpixel.

21. The display device according to claim 20, wherein the first subpixel comprises a first compensation capacitor between the gate node of the driving transistor of the first subpixel and the first gate line, and the third subpixel comprises a third compensation capacitor between the gate node of the driving transistor of the third subpixel and the first gate line, and wherein a capacitance of the third compensation capacitor is different from a capacitance of the first compensation capacitor.

22. A display device comprising:

a display area including:

a first area;

a second area spaced away from the first area; and a third area located between the first area and the second area; and a plurality of subpixels disposed in the display area, the plurality of subpixels including:

a first subpixel disposed in the first area;

a second subpixel disposed in the second area; and a third subpixel disposed in the third area;

wherein each of the first, second and third subpixels includes a light emitting element and a driving transistor for driving the light emitting element, and wherein, in operation, when first data corresponding to the first subpixel is equal to second data corresponding to the second subpixel, a luminance of the first subpixel is greater than a luminance of the second subpixel, and wherein each of the first subpixel and the third subpixel comprises an additional capacitor compared with the second subpixel, and the additional capacitor included in the first subpixel and the additional capacitor included in the third subpixel have different capacitances.

23. The display device according to claim 22, wherein when third data corresponding to the third subpixel is equal to the first data and the second data, a luminance of the third subpixel is greater than or equal to the luminance of the second subpixel, and less than or equal to the luminance of the first subpixel.

24. The display device according to claim 23, wherein a first gamma curve for the first area is different from a second gamma curve for the second area, and a third gamma curve for the third area is the same as the first gamma curve or the second gamma curve, or is different from the first gamma curve and the second gamma curve.

25. A display device comprising:

a display area including:

a first optical area including:

first transmission areas; and a first plurality of subpixels, each of the first plurality of subpixels including a first driving transistor and a first connection area corresponding to a gate node of the first driving transistor;

a second optical area including:

second transmission areas that have different shape than the first transmission areas; and a second plurality of subpixels, each of the second plurality of subpixels including a second driving transistor and a second connection area corresponding to a gate node of the second driving transistor; and a normal area laterally surrounding the first optical area and the second optical area, the normal area having lower transmissibility than those of the first optical area and the second optical area, the normal area including a third plurality of subpixels, each of the third plurality of subpixels including a third driving transistor and a third connection area corresponding to a gate node of the third driving transistor; and a gate line that overlaps a first subpixel of the first plurality of subpixels, a second subpixel of the second plurality of subpixels, and a third subpixel of the third plurality of subpixels;

wherein first capacitance between the gate node of the first driving transistor of the first subpixel and the gate line is greater than third capacitance between the gate node of the third driving transistor of the third subpixel and the gate line;

wherein second capacitance between the gate node of the second driving transistor of the second subpixel and the gate line is greater than the third capacitance.

* * * * *